US011929762B2

(12) United States Patent
Lee et al.

(10) Patent No.: US 11,929,762 B2
(45) Date of Patent: Mar. 12, 2024

(54) LOW DENSITY PARITY CHECK DECODER AND STORAGE DEVICE

(71) Applicant: Samsung Electronics Co., Ltd., Suwon-si (KR)

(72) Inventors: Kangseok Lee, Seoul (KR); Geunyeong Yu, Seongnam-si (KR); Youngjun Hwang, Osan-si (KR); Hongrak Son, Anyang-si (KR); Junho Shin, Suwon-si (KR); Bohwan Jun, Seoul (KR); Hyunseung Han, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 11 days.

(21) Appl. No.: 17/878,431

(22) Filed: Aug. 1, 2022

(65) Prior Publication Data
US 2023/0163785 A1     May 25, 2023

(30) Foreign Application Priority Data

Nov. 24, 2021    (KR) ........................ 10-2021-0162955
Jan. 19, 2022    (KR) ........................ 10-2022-0008006

(51) Int. Cl.
      *H03M 13/11*       (2006.01)
(52) U.S. Cl.
      CPC ...... *H03M 13/1137* (2013.01); *H03M 13/112* (2013.01); *H03M 13/1134* (2013.01)
(58) Field of Classification Search
      CPC ........... H03M 13/1137; H03M 13/112; H03M 13/1134; H03M 13/1114; H03M 13/3707;
(Continued)

(56) References Cited

U.S. PATENT DOCUMENTS 7,679,133 B2    3/2010    Son et al.
7,725,801 B2    5/2010    Jeong et al.
(Continued)

FOREIGN PATENT DOCUMENTS

JP           2012124888 A     6/2012
KR    1020070003294 A     1/2007
(Continued)

OTHER PUBLICATIONS

X. Li, Y. Abe, K. Shimizu, Z. Qiu, T. Ikenaga and S. Goto, "Cost-Efficient Partially-Parallel Irregular LDPC Decoder with Message Passing Schedule," 2007 International Symposium on Integrated Circuits, Singapore, 2007.*
(Continued)

*Primary Examiner* — Steve N Nguyen
(74) *Attorney, Agent, or Firm* — Muir Patent Law, PLLC

(57) ABSTRACT

A low density parity check (LDPC) decoder initializing variable nodes with a value of a codeword and outputting the updated variable nodes as decoded messages with reference to an irregular parity check matrix. The LDPC decoder includes a plurality of unit logic circuits operating in a single mode in which all the unit logic circuits update one variable node group including at least one variable node, or a multi-mode in which each of the unit logic circuits updates a plurality of variable node groups in parallel by updating different variable nodes, and a mode controller controlling the plurality of unit logic circuits to update a high-degree variable node group having a degree greater than a threshold degree among the variable node groups in the single mode, and update a low-degree variable node group having a degree less than or equal to the threshold degree among the variable node groups in the multi-mode.

20 Claims, 21 Drawing Sheets

(58) Field of Classification Search
CPC ......... H03M 13/6508; H03M 13/1128; H03M 13/1148; H04L 1/0052; H04L 1/0057; G06F 7/501; G06F 11/10
See application file for complete search history.

(56) References Cited

U.S. PATENT DOCUMENTS

| | | | |
|---|---|---|---|
| 7,886,208 B2 | 2/2011 | Moon et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 10,879,927 B2 | 12/2020 | Kalachev et al. | |
| 11,005,499 B2 | 5/2021 | Kim et al. | |
| 11,316,532 B1 | 4/2022 | Hsu et al. | |
| 11,575,389 B2* | 2/2023 | Bahary | H03M 13/1145 |
| 2007/0033486 A1* | 2/2007 | Hong | H03M 13/27 714/758 |
| 2007/0089019 A1* | 4/2007 | Tang | H03M 13/1102 714/752 |
| 2007/0127387 A1* | 6/2007 | Lee | H03M 13/27 370/252 |
| 2007/0168833 A1* | 7/2007 | Lestable | H03M 13/6511 714/758 |
| 2008/0178066 A1* | 7/2008 | Kim | H03M 13/1117 714/807 |
| 2009/0013237 A1* | 1/2009 | Lin | H03M 13/1111 714/776 |
| 2009/0307566 A1 | 12/2009 | No et al. | |
| 2011/0233648 A1 | 9/2011 | Seol et al. | |
| 2013/0139023 A1 | 5/2013 | Han et al. | |
| 2014/0068381 A1* | 3/2014 | Zhang | H03M 13/1131 714/752 |
| 2015/0067440 A1* | 3/2015 | Owen | H03M 13/1111 714/758 |
| 2015/0303944 A1* | 10/2015 | Sunwoo | H03M 13/1131 714/752 |
| 2019/0044537 A1 | 2/2019 | Reynwar et al. | |
| 2020/0162107 A1 | 5/2020 | Shutkin et al. | |
| 2020/0220557 A1 | 7/2020 | Reynwar et al. | |
| 2020/0220558 A1 | 7/2020 | Tseng et al. | |
| 2021/0013905 A1 | 1/2021 | Xiong et al. | |
| 2021/0149762 A1 | 5/2021 | Lee et al. | |

FOREIGN PATENT DOCUMENTS

| | | |
|---|---|---|
| KR | 1020070079513 A | 8/2007 |
| KR | 1020090126829 A | 12/2009 |
| KR | 100953936 B1 | 4/2010 |
| KR | 1020200058106 A | 5/2020 |
| KR | 102198121 B1 | 1/2021 |
| KR | 1020210061504 A | 5/2021 |

OTHER PUBLICATIONS

H. Xu, W. Wan, W. Wang, J. Wang, J. Yang and Y. Wen, "Comparison of parallelization strategies for min-sum decoding of irregular LDPC codes," in Tsinghua Science and Technology, vol. 18, No. 6, pp. 577-587, Dec. 2013.*

F. Kienle, T. Brack and N. Wehn, "Design of irregular LDPC Codes for flexible Encoder and Decoder Hardware Realization," 2006 International Conference on Software in Telecommunications and Computer Networks, Split, Croatia, 2006.*

Beuschel, C. et al., "Fully Programmable Layered LDPC Decoder Architecture," Proc. 17th European Signal Processing Conference 2009, Aug. 24, 2009(Aug. 24, 2009), pp. 1156-1160.

Extended European Search Report (EESR) dated Feb. 10, 2023 for corresponding patent application EP 22208814.8.

Hailes, P. et al., "A Flexible FPGA-Based Quasi-Cyclic LDPC Decoder," IEEE Access, vol. 5, Mar. 3, 2017 (Mar. 3, 2017),-Oct. 25, 2017(Oct. 25, 2017), pp. 20965-20984.

Pourjabar, S. et al., "A High-Throughput Multi-Mode LDPC Decoder for 5G NR," arxiv.org, Cornell University Library, 201 Olin Library Cornell University, Ithaca, NY 14853, Feb. 25, 2021 (Feb. 25, 2021).

* cited by examiner

Single Mode

Multi Mode

LOW DENSITY PARITY CHECK DECODER AND STORAGE DEVICE

CROSS-REFERENCE TO RELATED APPLICATION(S)

This application claims the benefit of priority under 35 USC 119(a) of Korean Patent Application No. 10-2021-0162955 filed on Nov. 24, 2021, and No. 10-2022-0008006 filed on Jan. 19, 2022 in the Korean Intellectual Property Office, the entire disclosures of which are incorporated herein by reference for all purposes.

BACKGROUND

Aspects of the present inventive concept relate to a low density parity check (LDPC) decoder and a storage device including the LDPC decoder.

A semiconductor memory is divided into a volatile memory device and a nonvolatile memory device. The volatile memory device may lose stored data when power thereto is cut off, but the nonvolatile memory device may retain stored data even when power thereto is cut off. In particular, since a flash memory has advantages such as a high programming speed, low power consumption, and high-capacity data storage, the flash memory has been widely used as a storage medium in computer systems and the like.

When data is programmed into memory cells of the nonvolatile memory, threshold voltages of the memory cells form a threshold voltage distribution of a certain range. The threshold voltage distribution may deteriorate as an operation of the nonvolatile memory continues. When the threshold voltage distribution deteriorates, many error bits may be included in data read by performing a read operation at a predefined read level.

Correct data may be obtained from the read data by performing error correction decoding on the read data. An example of error correction decoding is low density parity check (LDPC) decoding. The LDPC decoding is a decoding method that corrects errors in data by repeatedly performing updates of variable nodes and check nodes connected to each other. A connection relationship between the variable nodes and the check nodes may be defined by a parity check matrix.

When the number of check nodes connected to each of the variable nodes is not constant, an LDPC code may be referred to as an irregular LDPC code. When the number of check nodes connected to each of the variable nodes is different, the amount of computation required to update each variable node may vary. If the amount of computation required to update each variable node is different, when the LDPC decoder sequentially updates the variable nodes, computational resources of the LDPC decoder may not be fully utilized.

SUMMARY

Example embodiments provide an LDPC decoder with improved throughput and improved decoding latency.

Example embodiments also provide a storage device capable of accurately and quickly reading data stored in a memory cell using a low density parity check (LDPC) decoder.

According to example embodiments, a low density parity check (LDPC) decoder initializing variable nodes with a value of a codeword and outputting the updated variable nodes as decoded messages with reference to an irregular parity check matrix, the LDPC decoder includes: a plurality of unit logic circuits operating in a single mode in which all the unit logic circuits update one variable node group including at least one variable node, or a multi-mode in which each of the unit logic circuits updates a plurality of variable node groups in parallel by updating different variable nodes; and a mode controller controlling the plurality of unit logic circuits to update a high-degree variable node group having a degree greater than a threshold degree among the variable node groups in the single mode, and update a low-degree variable node group having a degree less than or equal to the threshold degree among the variable node groups in the multi-mode.

According to example embodiments, a low density parity check (LDPC) decoder includes: a data buffer buffering data encoded with an irregular LDPC code and providing a value of the data to variable nodes; a check node updater updating check nodes connected to the variable nodes; a variable node updater updating the variable nodes connected to the updated check nodes; and a syndrome checker outputting the values of the variable nodes as decoded data according to a syndrome check result of the updated variable nodes, wherein the variable node updater includes one or more unit logic circuit groups, and controls each of the unit logic circuit groups to update one variable node in one cycle or each of the unit logic circuits included in each of the unit logic circuit group to update different variable nodes in parallel in one cycle according to an amount of computation required for each of the variable nodes.

According to example embodiments, a storage device includes: a memory device storing data encoded with an irregular low density parity check (LDPC) code; and an LDPC unit initializing variable nodes with a value of data output from the memory device, updating check nodes connected to the variable nodes, updating the variable nodes by repeatedly performing an operation of updating Q (where Q is a natural number) variable nodes in one cycle or simultaneously updating Q*K (where K is a natural number) variable nodes in one cycle depending on whether degrees of each of the variable nodes exceed a threshold degree, and outputting values of the variable nodes according to a syndrome check result of the variable nodes.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, exemplary embodiments in the present disclosure will be described with reference to the accompanying drawings.

Figure 1:
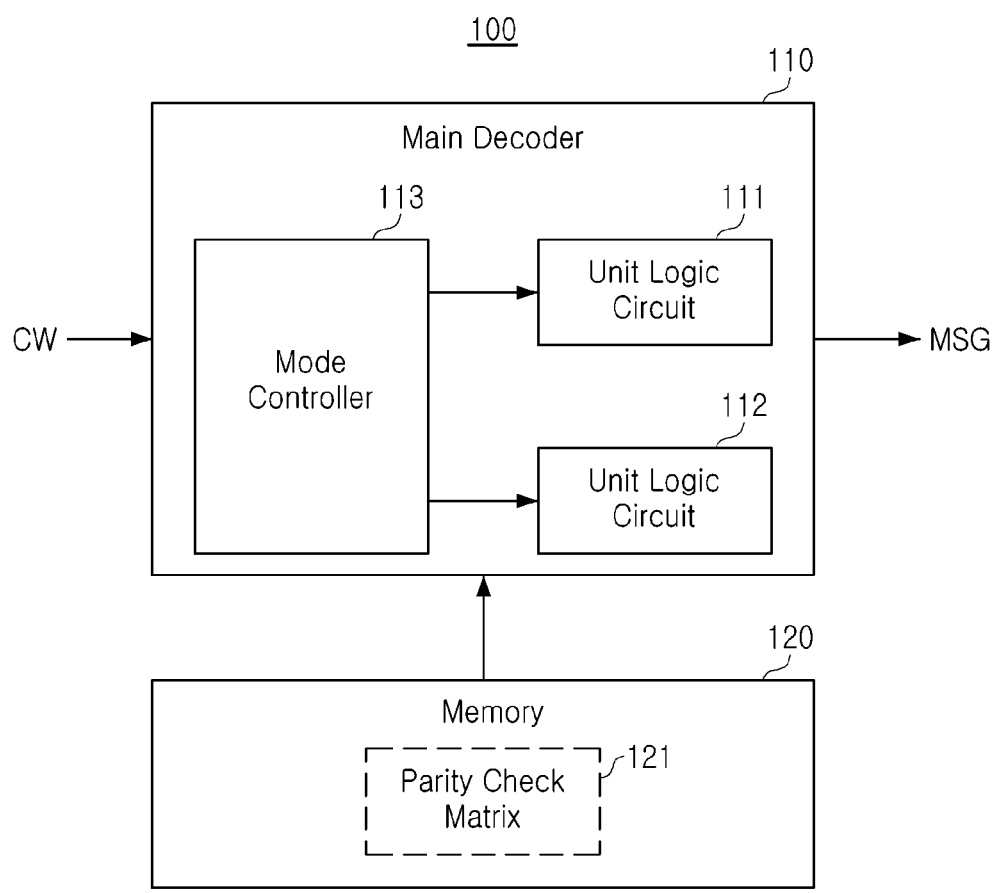
FIG. 1 is a block diagram illustrating a low density parity check (LDPC) decoder according to exemplary embodiments in the present disclosure.

FIG. 1 is a block diagram illustrating a low density parity check (LDPC) decoder 100 according to exemplary embodiments in the present disclosure.

Referring to FIG. 1, the LDPC decoder 100 may include a main decoder 110 and a memory 120.

The memory 120 may store data necessary for the main decoder 110 to perform error correction decoding. For example, the memory 120 may store a parity check matrix 121 for LDPC decoding. The memory 120 may provide decoded data to the main decoder 110 according to a request of the main decoder 110.

The main decoder 110 may receive a codeword CW from the outside. In addition, the main decoder 110 may receive the decoded data from the memory 120. The main decoder 110 may perform error correction decoding on the codeword CW with reference to data from the memory 120.

For example, the main decoder 110 may perform the error correction decoding on the codeword CW by repeatedly performing a check node update process and a variable node update process with reference to the parity check matrix 121. Each parity check that makes up the LDPC may be viewed as a single parity check (SPC) code. The decoding of each SPC code, may be referred to as the "check node update" processing, and the cross-checking of the variables is often referred to as the "variable-node update" processing. When the main decoder 110 successfully performs the error correction decoding on the codeword CW, the main decoder 110 may output the error-corrected data as a message MSG to the outside.

Meanwhile, the parity check matrix 121 may indicate a connection relationship between variable nodes and check nodes. The main decoder 110 may update the check node by performing an operation between the variable nodes connected to the check node with reference to the parity check matrix 121, and by performing an operation between the check nodes connected to the variable node, thereby updating the variable node.

The parity check matrix 121 may be classified into a regular parity check matrix and an irregular parity check matrix according to the number of check nodes connected to each of the variable nodes. The regular parity check matrix may refer to a matrix having the same number of check nodes connected to each of the variable nodes. In addition, the irregular parity check matrix may refer to a matrix in which the number of check nodes connected to each of the variable nodes is not the same. Hereinafter, the number of check nodes connected to the variable node may be referred to as a degree of the variable node.

In order to update a variable node, since operations on check nodes connected to the variable node need to be performed, as the degree of the variable node is higher, the amount of computation required to update the variable node may increase. The main decoder 110 may have sufficient computational resources to update the variable node having the maximum degree in one cycle. For example, one cycle may refer to one clock cycle. If the main decoder 110 updates one variable node in one period, the computational resources of the main decoder 110 may not be sufficiently utilized in the period in which the variable node having a relatively low degree is updated.

According to an exemplary embodiment in the present disclosure, the main decoder 110 may include a plurality of unit logic circuits 111 and 112 and a mode controller 113. The plurality of unit logic circuits 111 and 112 may provide the computational resources for updating the variable node. The plurality of unit logic circuits 111 and 112 may support at least two operation modes. For example, the plurality of unit logic circuits 111 and 112 may support a single mode in which all the plurality of unit logic circuits update one variable node, and a multi-mode in which each of the plurality of unit logic circuits updates a plurality of variable nodes in parallel by updating different variable nodes.

The mode controller 113 may control operation modes of the plurality of unit logic circuits 111 and 112. According to the exemplary embodiment in the present disclosure, the mode controller 113 may control the plurality of unit logic circuits 111 and 112 to update a high-degree variable node having a degree greater than a threshold degree among variable nodes in the single mode and update a low-degree variable node having a degree less than or equal to the threshold degree in the multi-mode.

Figure 2:
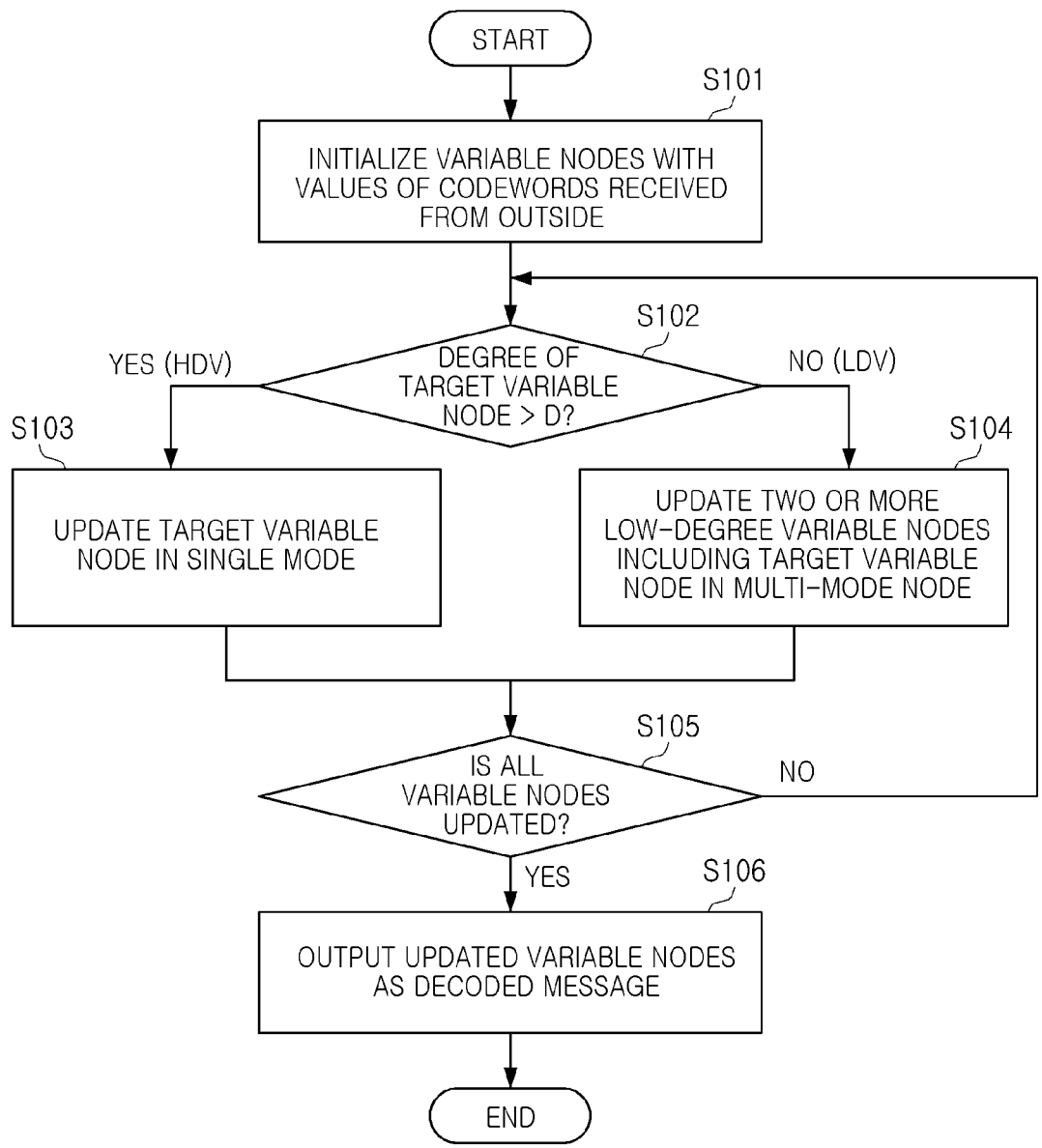
FIG. 2 is a flowchart illustrating an operation of the LDPC decoder according to the exemplary embodiments in the present disclosure.

FIG. 2 is a flowchart illustrating an operation of the LDPC decoder according to the exemplary embodiments in the present disclosure.

In step S101, the LDPC decoder may initialize the variable nodes with values of codewords received from the outside. In steps S102 to S105, the LDPC decoder may sequentially update the plurality of variable nodes. Hereinafter, a variable node to be currently updated among sequentially updated variable nodes may be referred to as a target variable node.

In step S102, the LDPC decoder may determine whether the degree of the target variable node is greater than the threshold degree d. For example, the LDPC decoder may determine the degree of the target variable node with reference to the parity check matrix stored therein, and compare the determined degree with the threshold degree d.

When the target variable node is a high-degree variable node (HDV) having a degree greater than the threshold degree d (Yes in step S102), the LDPC decoder in step S103 may update the target variable node in the single mode.

When the target variable node is a low-degree variable node (LDV) having a degree less than or equal to the threshold degree d (No in step S102), in step S104, the LDPC decoder may update two or more low-degree variable nodes including the target variable node in multi-mode. That is, two or more low-degree variable nodes may be updated in parallel in one cycle.

In step S105, the LDPC decoder may determine whether all variable nodes have been updated. When all the variable nodes are not updated (NO in step S105), the LDPC decoder may return to step S102 to update the variable nodes that have not been updated.

When all the variable nodes are updated ("Yes" in step S105), the LDPC decoder may complete the variable node update. In step S106, the LDPC decoder may output values of the updated variable nodes as a decoded message to the outside.

According to an exemplary embodiment in the present disclosure, the LDPC decoder may update a plurality of low-degree variable nodes in parallel by using sufficient computational resources to update the high-degree variable nodes. The LDPC decoder may fully utilize internal computational resources even in the cycle in which the low-degree variable node is updated. Accordingly, throughput of the LDPC decoder may be improved, and errors in codewords may be corrected quickly.

Hereinafter, the LDPC decoder according to exemplary embodiments in the present disclosure will be described in more detail with reference to FIGS. 3 to 13.

Figure 3:
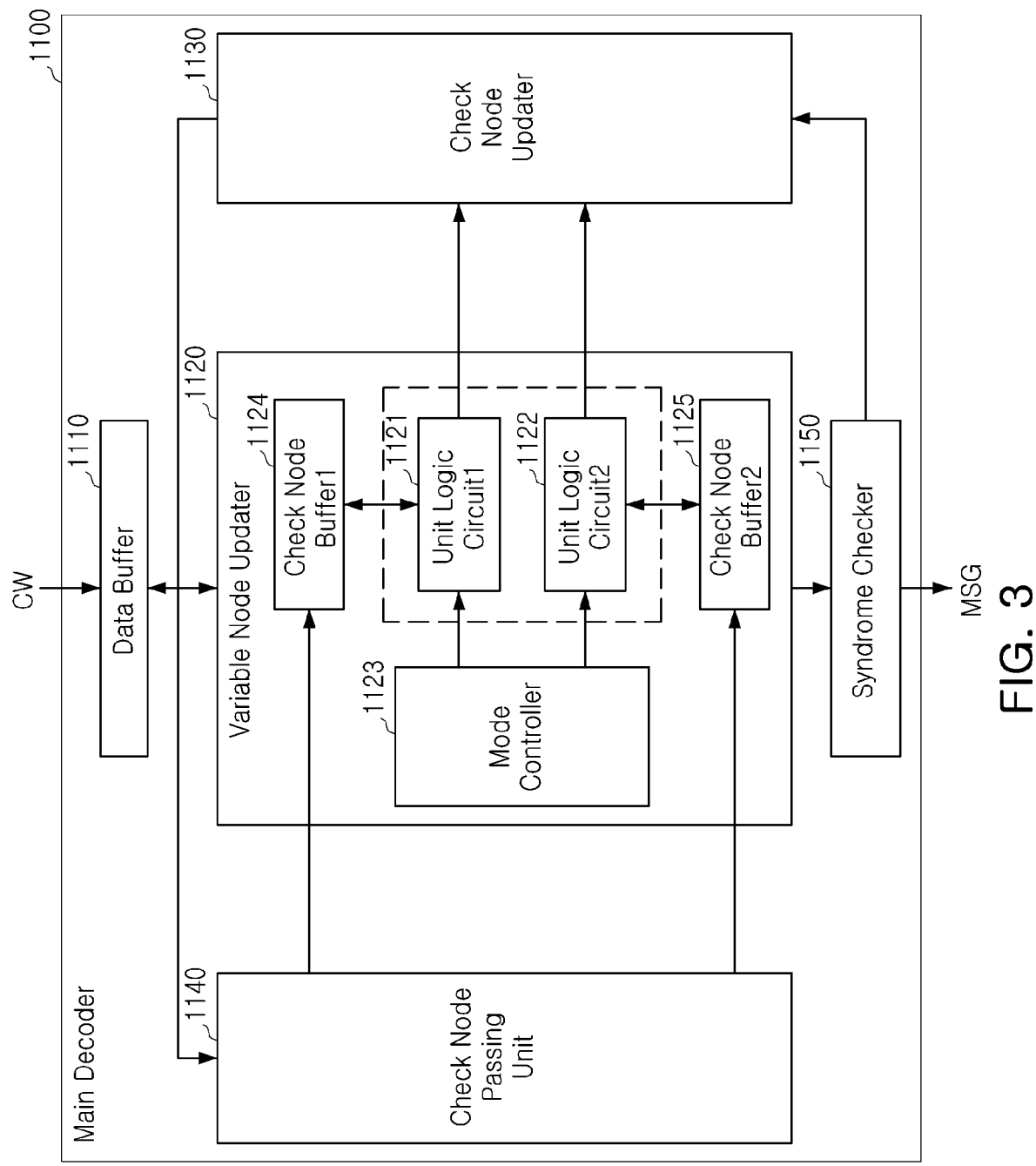
FIG. 3 is a block diagram for describing in more detail an LDPC decoder according to a first exemplary embodiment in the present disclosure.

FIG. 3 is a block diagram for describing in more detail an LDPC decoder according to a first exemplary embodiment in the present disclosure.

FIG. 3 illustrates a main decoder 1100 that may be included in an LDPC decoder. The main decoder 1100 may correspond to the main decoder 110 described with reference to FIG. 1.

The main decoder 1100 may include a data buffer 1110, a variable node updater 1120, a check node updater 1130, a check node passing unit 1140, and a syndrome checker 1150.

The data buffer 1110 may buffer the codeword CW received from the outside. The codeword CW may be data encoded by the LDPC decoder, and may be data in which parity is added to a message. The data buffer 1110 may further receive and buffer a log likelihood ratio (LLR) corresponding to each bit of the codeword CW from the outside.

The variable node updater 1120 may initialize the variable nodes based on the codeword CW and the log likelihood ratio. The variable nodes may correspond to bits of the codeword CW.

The check node updater 1130 may update the values of the check nodes by using the values of the variable nodes stored in the data buffer 1110. For example, the check node updater 1130 may update the check node by performing a minimum value (min) operation between the variable nodes connected to the check node.

The check node passing unit 1140 may pass the values of the check nodes updated by the check node updater 1130 to the variable node updater 1120.

The variable node updater 1120 may update the variable nodes based on messages from the check node passing unit 1140. According to an exemplary embodiment in the present disclosure, the variable node updater 1120 may include a plurality of unit logic circuits 1121 and 1122, a mode controller 1123, and a plurality of check node buffers 1124 and 1125.

The plurality of unit logic circuits 1121 and 1122 and the mode controller 1123 may correspond to the plurality of unit logic circuits 111 and 112 and the mode controller 113 described with reference to FIG. 1. That is, the plurality of unit logic circuits 1121 and 1122 may operate in a single mode in which all the unit logic circuits 121 and 122 update one variable node, or in a multi-mode in which each of the unit logic circuits 121 and 122 updates a plurality of variable nodes by updating one variable node. The mode controller 113 may control the plurality of unit logic circuits 1121 and 1122 to operate in the single mode or the multi-mode based on the degree of the target variable node to be updated.

When the target variable node is a high-degree variable node, the plurality of unit logic circuits 1121 and 1122 may operate in the single mode. Although it will be described in more detail with reference to FIGS. 4 to 8, in order to update the variable node, a sum operation may be performed on check nodes connected to the variable node. The check nodes connected to the target variable node may be divided into first check nodes and second check nodes. In the single mode, the first unit logic circuit 1121 may perform the sum operation on the first check nodes, and the second unit logic circuit 1122 may perform the sum operation on the second check nodes, thereby updating the target variable node.

When the target variable node is the low-degree variable node, the plurality of unit logic circuits 1121 and 1122 may operate in the multi-mode. For example, first and second target variable nodes that are the low-degree variable nodes may be updated in parallel in the plurality of unit logic circuits 1121 and 1122. Specifically, in the multi-mode, the first unit logic circuit 1121 may perform a sum operation on check nodes connected to the first target variable node, and the second unit logic circuit 1122 may perform a sum operation on check nodes connected to the second target variable node.

Each of the plurality of unit logic circuits 1121 and 1122 may include an adder having two or more inputs to perform the sum operation on the check nodes.

The plurality of check node buffers 1124 and 1125 may buffer values of the check nodes passed from the check node passing unit 1140. Specifically, the first check node buffer 1124 may be electrically connected to the first unit logic circuit 1121, and may buffer values of the check nodes to be calculated in the first unit logic circuit 1121. Further, the second check node buffer 1125 may be electrically connected to the second unit logic circuit 1122, and may buffer values of the check nodes to be calculated in the second unit logic circuit 1122.

Meanwhile, although omitted in FIG. 3, the variable node updater 1120 may further include an adder for synthesizing the operation results of the first check nodes and the second check nodes by the plurality of unit logic circuits 111 and 112 in the single mode. In addition, the variable node updater 1120 may further include a quantizer for quantizing each of the updated variable nodes to 0 or 1 according to the magnitudes of the values of the updated variable nodes. The quantized data may be output to the outside as decoded data.

The syndrome checker 1150 may obtain the decoded data from the variable node updater 1120 and perform a parity check operation on the obtained data. The syndrome checker 1150 may obtain a syndrome vector by performing a matrix operation on the parity check matrix stored in the LDPC decoder and each bit of the obtained data. For example, when all components of the syndrome vector have a value of "0," the decoded data may be determined to have a correct value, and when any one of the components of the syndrome vector does not have a value of "0," the decoded data may be determined to have an error.

When it is determined that there is no error in the decoded data, the syndrome checker 1150 may output the decoded data as an error-corrected message (MSG) to the outside. On the other hand, when it is determined that there is an error in the decoded data, the syndrome checker 1150 may provide a signal to the check node updater 1130 to repeatedly perform the check node update process and the variable node update process.

Hereinafter, the operation of the LDPC decoder will be described in more detail with reference to FIGS. 4 to 8.

Figure 4:
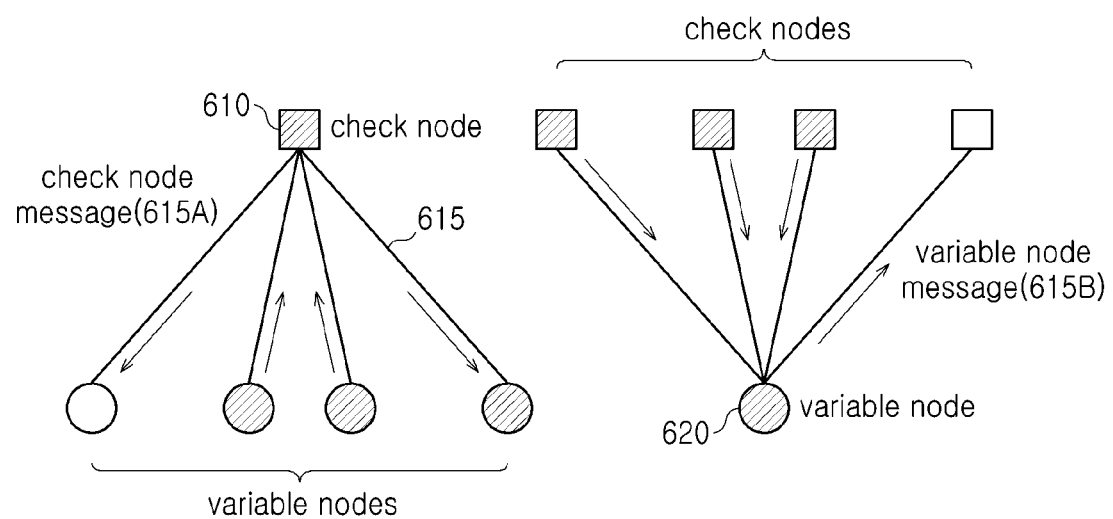
FIG. 4 is a conceptual diagram illustrating LDPC decoding represented by a Tanner graph.

FIG. 4 is a conceptual diagram illustrating LDPC decoding represented by a Tanner graph.

An LDPC code may refer to a code having a very small number of "1s" in each row and column of the parity check matrix defining the LDPC code. Referring to FIG. 4, the LDPC code includes check nodes 610 and variable nodes 620, and a structure of the LDPC code may be defined by a Tanner graph composed of edges 615 connecting the check nodes 610 and the variable nodes 620.

The value passed from the check node 610 to the variable node 620 after the check node update process is a check node message 615A, and the value passed from the variable node 620 to the check node 610 after the update of the variable node is a variable node message 615B.

Figure 5:
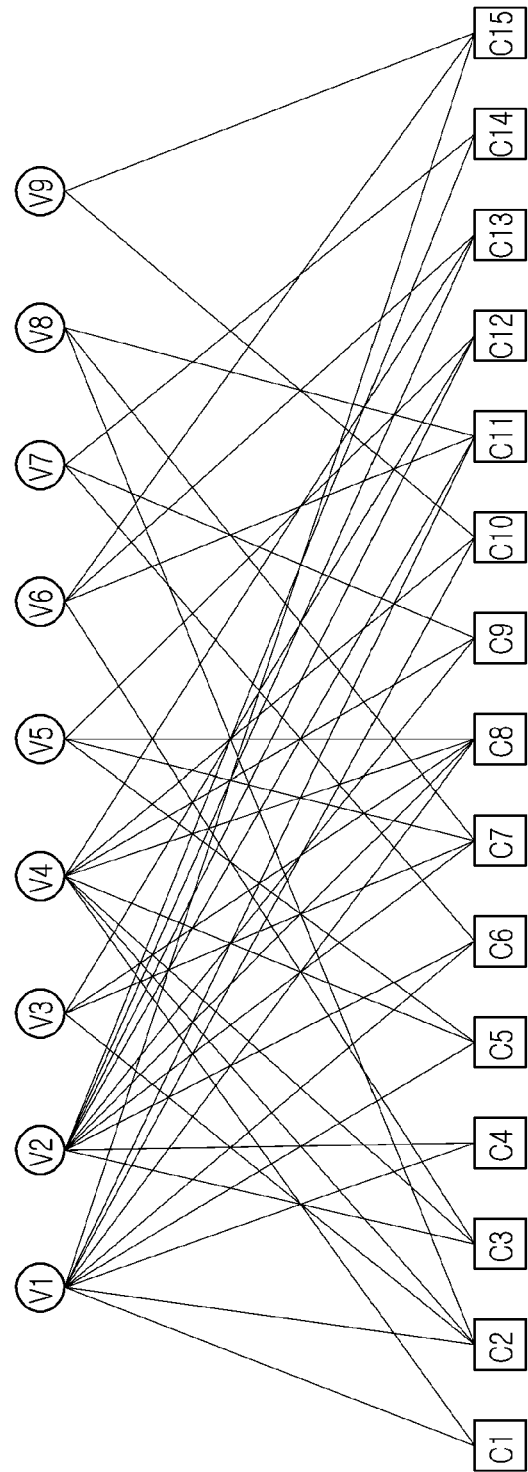
FIG. 5 is a diagram illustrating a Tanner graph of an irregular LDPC code.

FIG. 5 is a diagram illustrating the Tanner graph of the LDPC code.

Referring to FIG. 5, the Tanner graph of the LDPC code includes 15 check nodes C1 to C15 representing a parity check equation of a predetermined LDPC code, and nine variable nodes V1 to V9 representing each symbol of a codeword, and edges representing a connection relationship between the check nodes C1 to C15 and the variable nodes V1 to V9. The edges may connect the check nodes C1 to C15 and the variable nodes V1 to V9 according to the parity check matrix. Initial values of the variable nodes V1 to V9 may be hard decision data or soft decision data. Meanwhile, the number of variable nodes and check nodes illustrated in FIG. 5 is only an example, and the LDPC code may include tens of thousands of variable nodes and thousands of check nodes.

FIG. 5 illustrates an irregular LDPC code in which the number of variable nodes connected to each of the check nodes C1 to C15 is different and the number of variable nodes connected to each of the variable nodes V1 to V9 is different. That is, in the LDPC code represented by the Tanner graph of FIG. 5, variable nodes may have different degrees.

Figure 6A:
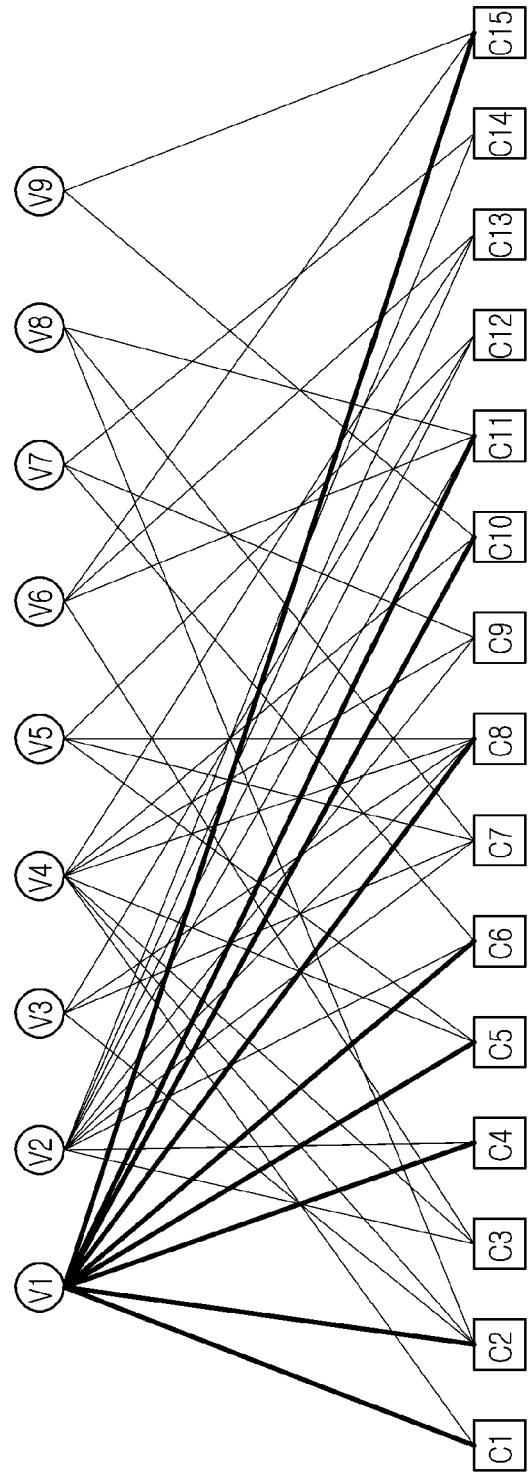
FIGS. 6A and 6B are diagrams illustrating variable nodes having different degrees in the Tanner graph of FIG. 5.
Figure 6B:
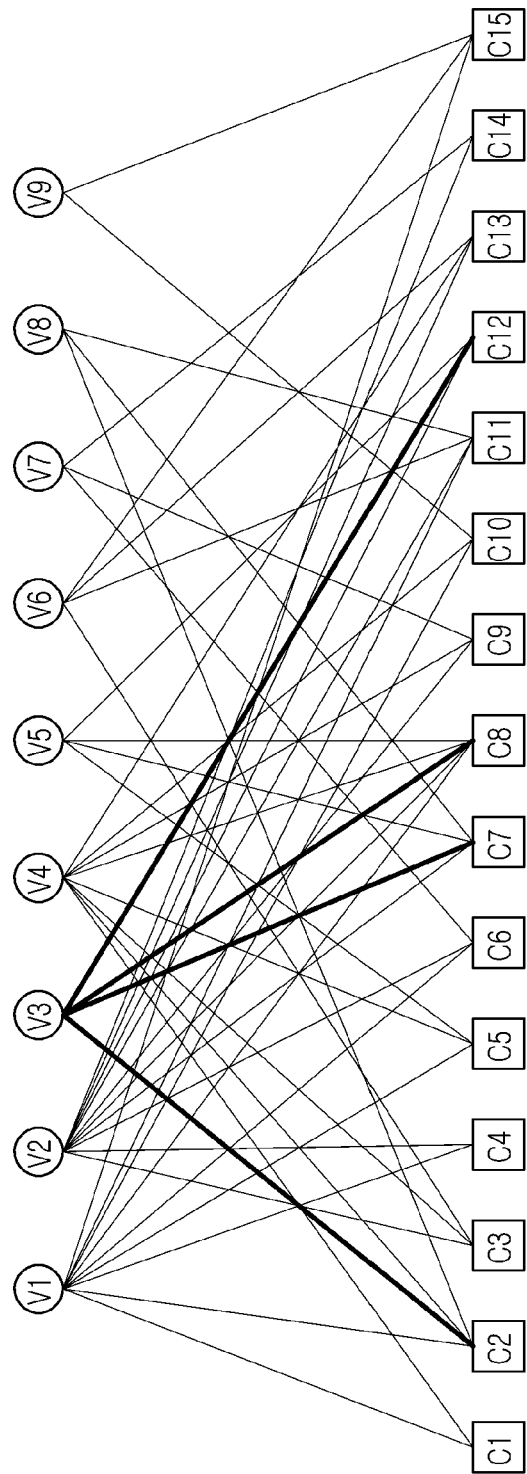

FIGS. 6A and 6B are diagrams illustrating variable nodes having different degrees in the Tanner graph of FIG. 5.

FIG. 6A illustrates edges representing a connection relationship between the first variable node V1 and the check nodes in the Tanner graph of FIG. 5 by thick lines. Referring to FIG. 6A, the first variable node V1 may be connected to nine check nodes C1, C2, C4, C5, C6, C8, C10, C11, and C15, and the degree of the first variable node V1 may be FIG. 6B illustrates edges representing a connection relationship between a third variable node V3 and the check nodes in the Tanner graph of FIG. 5 by thick lines. Referring to FIG. 6B, the third variable node V3 may be connected to four check nodes C2, C7, C8, and C12, and a degree of the third variable node V3 may be "4."

Figure 7:
FIG. 7 is a diagram illustrating a parity check matrix corresponding to the Tanner graph of FIG. 5.
Figure 7:
Figure 7:

FIG. 7 is a diagram illustrating a parity check matrix corresponding to the Tanner graph of FIG. 5.

The parity check matrix may include a plurality of columns and a plurality of rows. The plurality of columns may correspond to the variable nodes V1 to V9, and the plurality of rows may correspond to the check nodes C1 to C15. In the parity check matrix of FIG. 7, a component at a point where the interconnected variable node and the check node intersect may have a value of "1," and a component at a point where the disconnected variable node and the check node intersect may have a value of "0." In FIG. 7, a pattern is illustrated at a point where there is "1," and no pattern is illustrated at a point where there is "0."

Similar to the Tanner graph illustrated in FIG. 5, a different number of "1s" may exist in each column of the parity check matrix illustrated in FIG. 7. That is, the degrees of variable nodes may be different from each other. For example, nine "1s" in a column of the first variable node V1 may indicate nine check nodes connected to the first variable node V1. As another example, four "1s" in a column of the third variable node V3 may indicate four check nodes connected to the third variable node V3.

The amount of computation required to update one variable node may be determined based on the number of check nodes connected to the variable nodes, that is, the degree of the variable node. For example, in order to update the first variable node V1, an operation may be performed on messages from nine check nodes, and in order to update the third variable node V3, an operation may be performed on messages from four check nodes. Accordingly, as the degree of the variable node is higher, the amount of computation required to update the variable node may increase.

According to an exemplary embodiment in the present disclosure, the LDPC decoder may control a plurality of unit logic circuits to update one high-degree variable node in which the amount of computation required in one cycle is greater than the threshold amount, or update two or more low-degree variable nodes in which the amount of computation required in one cycle is less than or equal to the threshold amount of computation. Even when the low-degree variable node is updated, the computational resources provided by the plurality of unit logic circuits may be fully utilized, so that the throughput of the LDPC decoder may increase.

Meanwhile, which variable node is the high-degree variable node or the low-degree variable node may be determined relatively in relation to other variable nodes. For example, in the example of FIG. 7, the degree of variable nodes V1-V9 is one of 2, 3, 4, 8, and 9. The plurality of unit logic circuits may provide sufficient computational resources to update a variable node having the highest degree "9" in one cycle.

When the LDPC decoder includes two unit logic circuits having equal computational resources, one unit logic circuit may have sufficient computational resources to update a variable node having a degree of 2 to 4. For example, two unit logic circuits may each include an adder having five inputs. Since the two unit logic circuits may process a total of 10 inputs, it is possible to update a variable node having a degree of 9 in the single mode, and it is possible to update variable nodes having degrees of 2 to 4 in the multi-mode.

In the above example, the LDPC decoder may use all the plurality of unit logic circuits to update a variable node having a degree of 8 or 9 as a high-degree variable node. On the other hand, the LDPC decoder may use each of the plurality of unit logic circuits to update variable nodes having degrees of 2 to 4 as low-degree variable nodes in parallel.

That is, the threshold degree for dividing the high-degree variable node from the low-degree variable node may be determined based on the maximum degree among the degrees of the variable nodes and the number of the plurality of unit logic circuits. In particular, when the unit logic circuits include an adder, the threshold degree may not exceed the number of inputs of the adder. In other words, the threshold amount of computation may not exceed the maximum amount of computation of each of the unit logic circuits.

Figure 8:
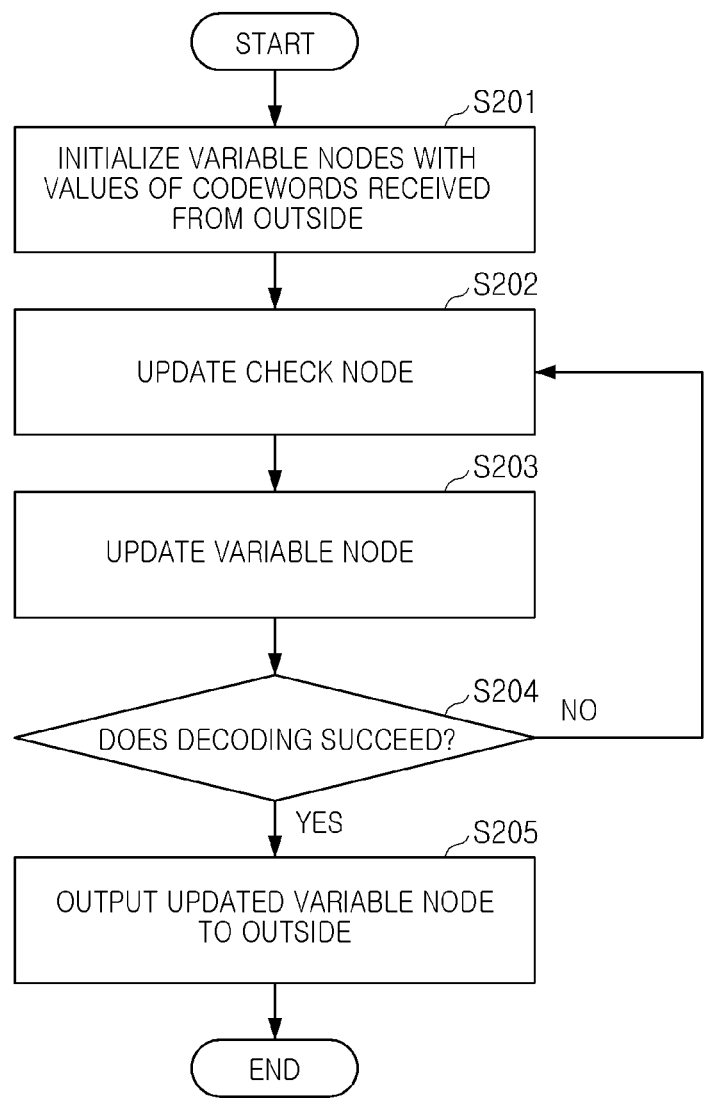
FIG. 8 is a flowchart illustrating an operation of an LDPC decoder.

FIG. 8 is a flowchart illustrating an operation of the LDPC decoder.

The LDPC decoder may perform the LDPC decoding by repeating a process in which variable nodes and check nodes exchange messages generated and updated for each node. The variable node update process and the check node update process may be performed by various methods. Hereinafter, the operation of the LDPC decoder will be described taking, as an example, a case where the variable nodes and check nodes are updated by a min-sum method.

In step S201, the LDPC decoder may initialize the variable nodes to values of codewords received from the outside. Each variable node may correspond to each bit of the codeword.

In step S202, the LDPC decoder may update the check nodes using a minimum value (min) operation. For example, when passing a message from the check node to the target variable node, the LDPC decoder may pass, as the message, a minimum value among the remaining variable nodes other than the target variable node among the variable nodes connected to the check node. The LDPC decoder may store a minimum value, a quasi-minimum value, and a code of the minimum value among the values of the variable nodes connected to the check node in order to pass such a message.

In step S203, the LDPC decoder may update the variable nodes using the sum operation. For example, when passing the message from the variable node to the target check node, the LDPC decoder may pass, as the message, a sum of the remaining variable nodes other than the target check node among the check nodes connected to the variable node. The LDPC decoder may perform the sum operation of the values of the check nodes connected to the variable node in order to pass such a message.

Examples of a method of updating variable nodes using a plurality of unit logic circuits according to an exemplary embodiment in the present disclosure will be described later with reference to FIGS. 9A and 9B.

In step S204, the LDPC decoder may determine whether LDPC decoding succeeds by performing a syndrome check based on the values of the updated variable nodes. For example, the LDPC decoder may generate a syndrome vector by quantizing the values of the variable nodes and performing a product operation on the parity check matrix and the quantized values. The LDPC decoder may determine that LDPC decoding has succeeded when the syndrome vector is a zero vector, and otherwise, may determine that LDPC decoding has failed.

When the LDPC decoding succeeds ("Yes" in step S204), the LDPC decoder may output the quantized values as the decoded data to the outside.

On the other hand, when the LDPC decoding has failed (No in step S204), the LDPC decoder may return to step S202 to repeatedly update the check node, the variable node, and the syndrome check.

Figure 9A:
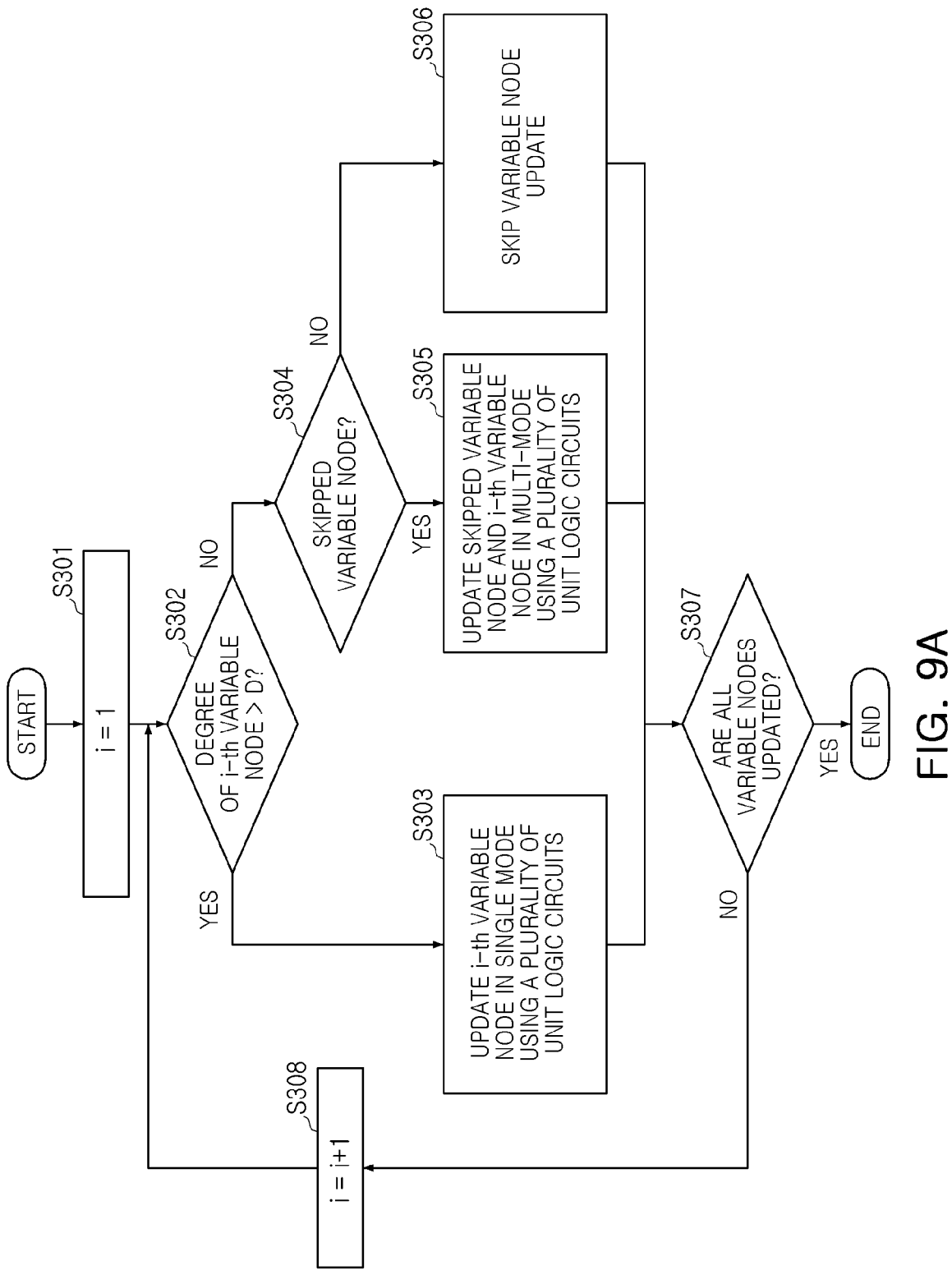
FIGS. 9A and 9B are flowcharts illustrating a method of updating a variable node of the LDPC decoder according to the first exemplary embodiment in the present disclosure.
Figure 9B:
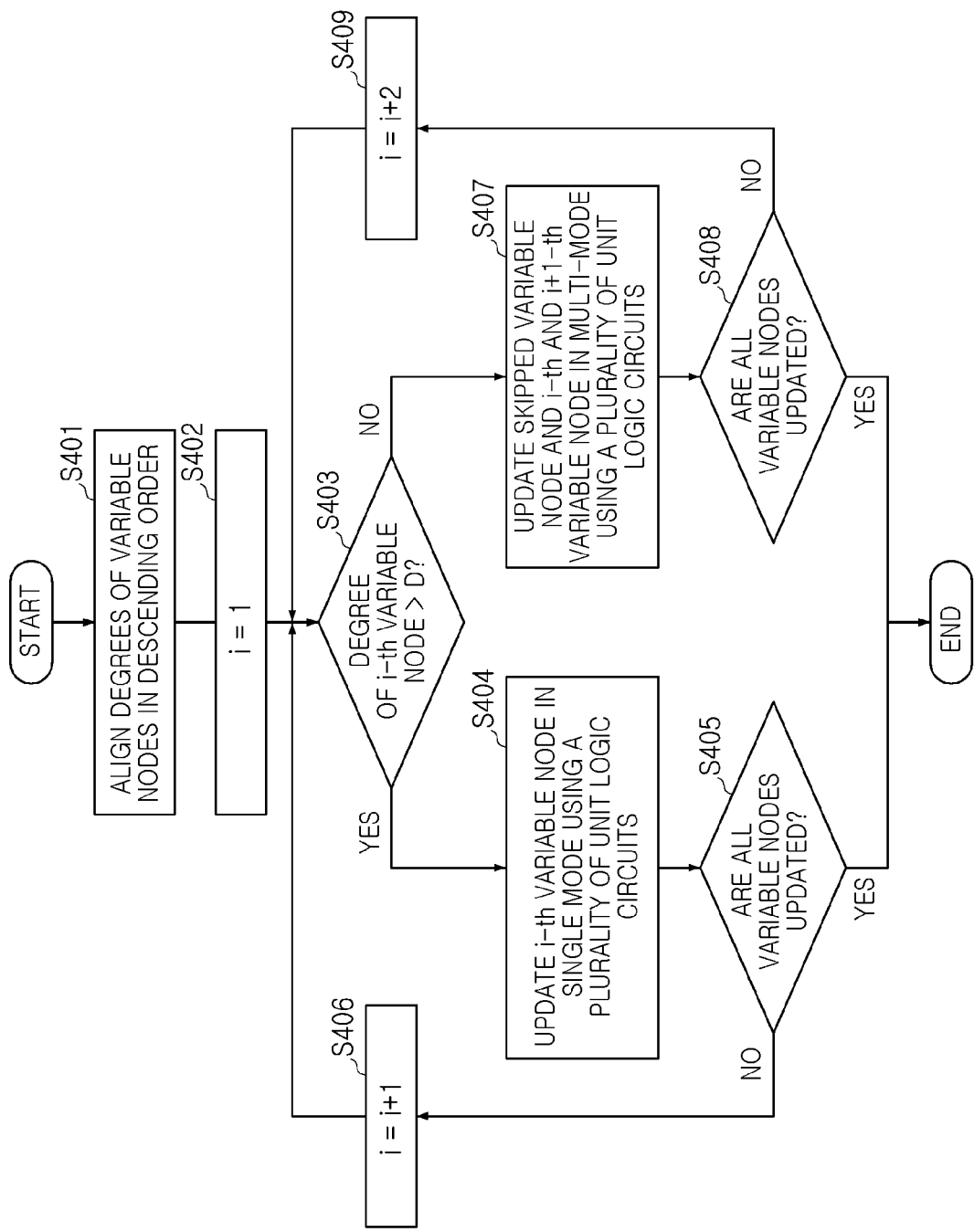

FIGS. 9A and 9B are flowcharts illustrating a method of updating a variable node of the LDPC decoder according to the first exemplary embodiment in the present disclosure.

In the example of FIG. 9A, the LDPC decoder may update the variable nodes in column order of the parity check matrix.

In step S301, the mode controller of the LDPC decoder may perform initialization for updating from a first variable node.

In step S302, the mode controller may determine whether a degree of an i-th (i is a natural number) variable node, that is, a target variable node to be updated is greater than the threshold degree d.

When the target variable node is a high-degree variable node having a degree greater than the threshold degree d (YES in step S302), the mode controller may control the plurality of unit logic circuits to update the target variable node in the single mode in step S303.

On the other hand, when the target variable node is a low-degree variable node having a degree less than or equal to the threshold degree d (No in step S302), the mode controller may determine whether to skip the update of the low-degree variable node in step For example, when there is the already skipped low-degree variable node ("Yes" in step S304), the mode controller may control the plurality of unit logic circuits to update the skipped variable node and the target variable node in the multi-mode, that is, in parallel in step S305.

On the other hand, if there is no skipped low-degree variable node (No in step S304), the mode controller may skip the update of the target variable node until the low-degree variable node that may be updated in parallel with the target variable node is identified. When there is no skipped low-degree variable node (No in step S304), a skip variable node update is subsequently performed in step S306 to thereby indicate that a skipped low-degree variable node is now present.

In step S307, the mode controller may determine whether all the variable nodes have been updated. When all the variable nodes are not updated (No in step S307), the mode controller may update a next variable node by performing step S308. On the other hand, when all the variable nodes are updated ("Yes" in step S307), the mode controller may complete the variable node update.

In the example of FIG. 9B, the LDPC decoder may update the variable nodes in descending order of degree.

The mode controller of the LDPC decoder may align the variable nodes in descending order of degree in step S401 and perform initialization for updating from the variable node having the highest degree in step S402.

In step S403, the mode controller may determine whether a degree of an i-th variable node, that is, a target variable node to be updated is greater than the threshold degree d.

When the target variable node is a high-degree variable node having a degree greater than the threshold degree d ("YES" in step S403), the mode controller may control the plurality of unit logic circuits to update the target variable node in the single mode in step S404.

In step S405, the mode controller may determine whether all the variable nodes have been updated. When all the variable nodes are updated ("Yes" in step S307), the mode controller may complete the variable node update. On the other hand, when all the variable nodes are not updated (No in step S405), the mode controller may update a next variable node by performing step S406.

When the target variable node is a low-degree variable node having a degree less than or equal to the threshold degree d ("NO" in step S403), a next variable node of the target variable node may also be a low-degree variable node. The mode controller may control the plurality of unit logic circuits to update the target variable node and the next variable node in multi-mode in step S407.

In step S408, the mode controller may determine whether all the variable nodes have been updated. When all the variable nodes are not updated (No in step S408), the mode controller may update the next variable node by performing step S409. On the other hand, when all the variable nodes are updated ("Yes" in step S408), the mode controller may complete the variable node update.

According to an exemplary embodiment in the present disclosure, the LDPC decoder may switch the operation mode of the plurality of unit circuits in runtime according to the degree of the target variable node in a process of updating the variable nodes in a predetermined order. The LDPC decoder may update a plurality of low-degree variable nodes in one cycle using the computational resources that may update the high-degree variable node in one cycle. Accordingly, the time required for updating the variable nodes may decrease, and the computational resources of the LDPC decoder may be effectively used.

Figure 10:
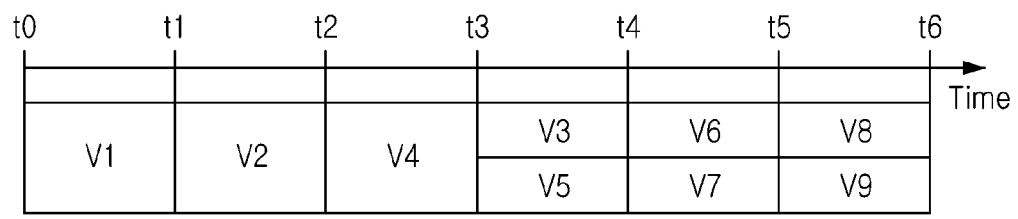
FIG. 10 is a timing diagram of an LDPC decoding operation according to the first exemplary embodiment in the present disclosure.

FIG. 10 is a timing diagram of an LDPC decoding operation according to the first exemplary embodiment in the present disclosure.

FIG. 10 illustrates six time periods divided by seven time points t0 to t6. Each time period may correspond to one cycle for updating a variable node. FIG. 10 illustrates at which time period of the six time periods variable nodes V1 to V9 are updated. The variable nodes V1 to V9 may correspond to the variable nodes V1 to V9 illustrated in FIGS. 5 to 7. That is, the variable nodes V1, V2, and V4 may be the high-degree variable nodes, and the variable nodes V3 and V5 to V9 may be the low-degree variable nodes.

Referring to FIG. 10, the high-degree variable nodes may be updated one by one in a time period t0 to t1, a time period t1 to t2, and a time period t2 to t3. On the other hand, the low-degree variable nodes may be updated in parallel two by two in a time period t3 to t4, a time period t4 to t5, and a time period t5 to t6. In the example of FIG. 10, nine variable nodes V1 to V9 may be updated during six cycles by updating the low-degree variable nodes in parallel. According to the exemplary embodiment in the present disclosure, the variable node update process time may be shortened by about 33% compared to the case of updating one variable node during one cycle. Accordingly, the decoding performance of the LDPC decoder may be improved.

Figure 11A:
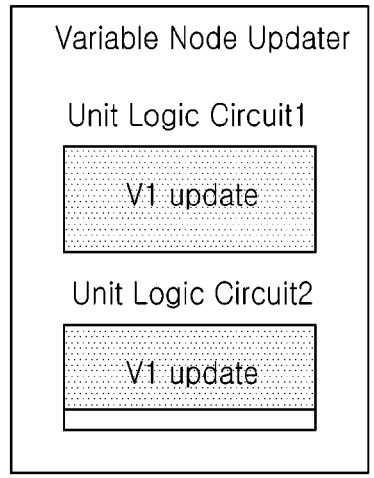
FIGS. 11A and 11B are diagrams illustrating a computational resource usage rate according to an operation mode of the LDPC decoder according to the first exemplary embodiment in the present disclosure.
Figure 11B:
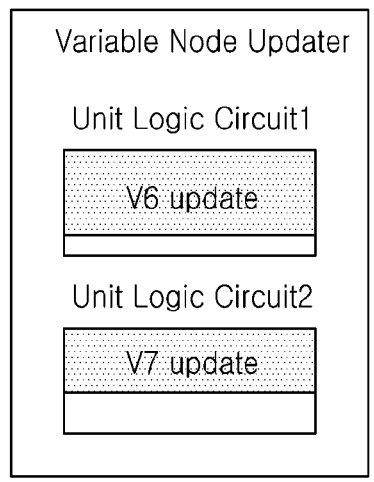

FIGS. 11A and 11B are diagrams illustrating a computational resource usage rate according to an operation mode of the LDPC decoder according to the first exemplary embodiment in the present disclosure.

FIG. 11A illustrates a computational resource usage rate when the variable node updater of the LDPC decoder updates the first variable node V1, which is the high-degree variable node, in a single mode. For example, when the variable node update unit includes two unit logic circuits and each unit logic circuit includes an adder having 5 inputs, the variable node update unit may perform a sum operation on 10 inputs in one cycle.

Shades illustrated in the unit logic circuits of FIG. 11A schematically illustrate the computational resource usage rate of each of the unit logic circuits. Since a sum operation on nine check nodes may be performed to update the first variable node V1 with a degree of 9, in order to update the first variable node V1, a total of about 90% of the computational resources provided by the unit logic circuits may be used.

FIG. 11B schematically illustrates the computational resource usage rate when the variable node updater of the LDPC decoder updates the sixth and seventh variable nodes V6 and V7, which are the low-degree variable nodes, in the multi-mode. The variable node updater may include two unit logic circuits, and each unit logic circuit may include an adder having 5 inputs. The first unit logic circuit may perform a sum operation on four check nodes to update the sixth variable node V6 having a degree of 4, and the second unit logic circuit may perform a sum operation on three check nodes to update the seventh variable node V7 having a degree of 3. The LDPC decoder may use a total of about 70% of the computational resources provided by the unit logic circuits while simultaneously updating the sixth and seventh variable nodes V6 and V7.

According to an exemplary embodiment in the present disclosure, the LDPC decoder may efficiently utilize the computational resources provided by the unit logic circuits even the case of updating the low-degree variable node. Accordingly, it is possible to improve the throughput of the LDPC decoder.

Meanwhile, the present disclosure has been described with reference to FIGS. 3 to 11B, taking as an example a case in which the LDPC decoder updates one or two variable nodes in one cycle, but the present disclosure is not limited thereto. For example, the LDPC decoder may include three or more unit logic circuits, and the LDPC decoder may update three or more variable nodes in the multi-mode.

In addition, when the LDPC decoding is performed using a quasi-cyclic (QC) LDPC code with improved parallelism or the like, the LDPC decoder may update Q (where Q is a natural number) variable nodes in parallel in the single mode, and update Q*K (where K is a natural number) variable nodes in parallel in the multi-mode. Hereinafter, an LDPC decoder according to a second exemplary embodiment in the present disclosure will be described with reference to FIGS. 12 and 13.

Figure 12:
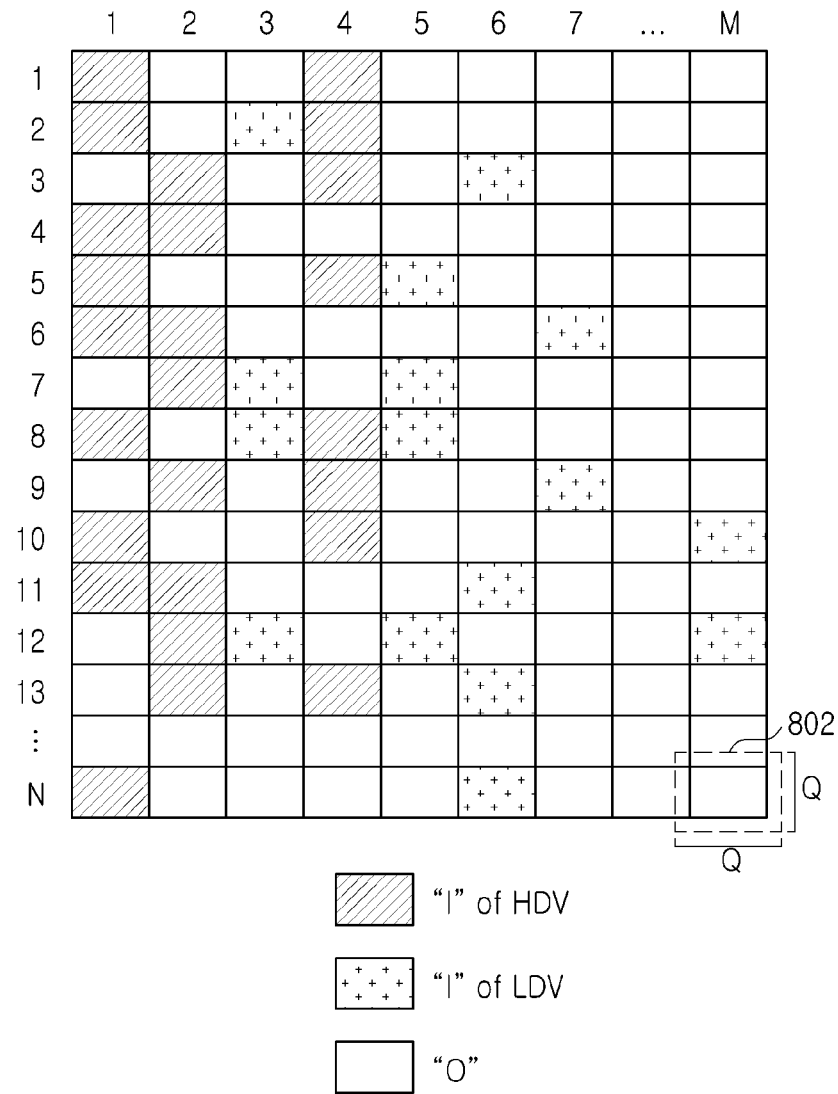
FIG. 12 is a diagram illustrating a parity check matrix according to a second exemplary embodiment in the present disclosure.

FIG. 12 is a diagram illustrating a parity check matrix according to a second exemplary embodiment in the present disclosure.

The parity check matrix of FIG. 12 may include M*N (M and N are a natural number) sub-matrices 802. Each of the sub-matrices 802 may be a zero matrix O or a Q*Q-dimensional cyclically shifted identification matrix I. Each component of the parity check matrix defining the binary LDPC code may be determined to be 0 or 1.

As described with reference to FIG. 5, the structure of the LDPC code may be defined by a Tanner graph composed of check nodes, variable nodes, and edges connecting between the check nodes and variable nodes.

The check nodes and variable nodes constituting the Tanner graph may each correspond to columns and rows of the parity check matrix, respectively. Accordingly, the number (M*Q) of columns and the number (N*Q) of rows of the parity check matrix may correspond to the number of check nodes and the number of variable nodes constituting the Tanner graph, respectively. When a component of the parity check matrix is 1, the check node and the variable node each corresponding to a row and a column in which the component is located may be connected by an edge on the Tanner graph.

In the parity check matrix of FIG. 12, a pattern is shown at a position corresponding to the cyclic shift identity matrix I, and no pattern is shown at a position corresponding to the zero matrix O. The number of "1s" in each column may correspond to the number of cyclic shift identity matrices I associated with each column. The number of cyclic shift identity matrices I connected to each column may be different, and each column of the parity check matrix may have a different number of "1s." That is, degrees of each variable node of the parity check matrix may be different.

Meanwhile, in the parity check matrix, Q variable nodes corresponding to Q columns included in the same submatrix may be updated in parallel. According to an exemplary embodiment in the present disclosure, the LDPC decoder may have sufficient computational resources to update Q high-degree variable nodes in parallel in one cycle. In addition, the LDPC decoder may update Q*K (where K is a natural number) low-degree variable nodes in parallel in one cycle using the computational resource.

Figure 13:
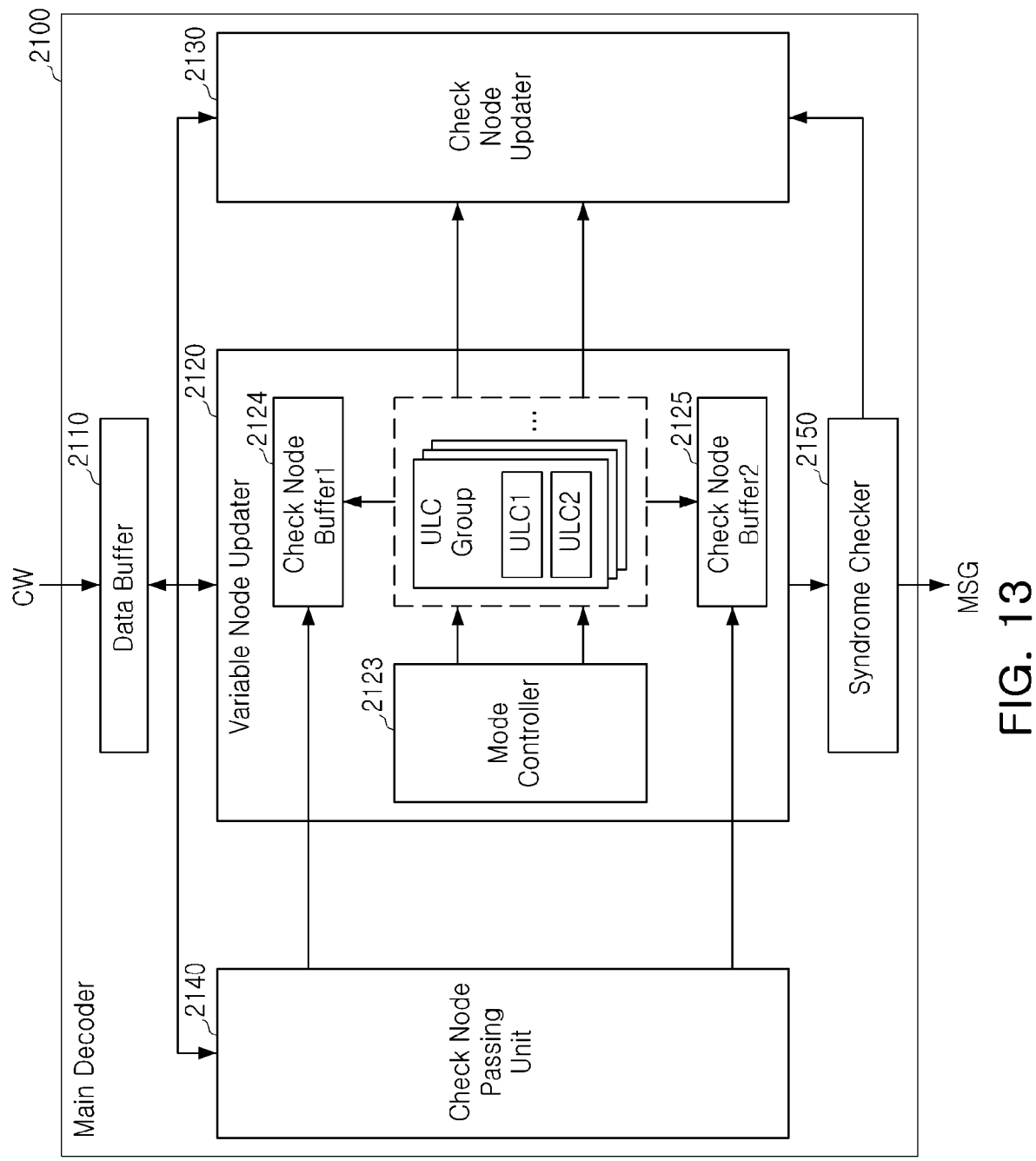
FIG. 13 is a block diagram for describing in more detail an LDPC decoder according to the second exemplary embodiment in the present disclosure.

FIG. 13 is a block diagram for describing in more detail an LDPC decoder according to the second exemplary embodiment in the present disclosure.

FIG. 13 illustrates a main decoder 2100 that may be included in an LDPC decoder. The main decoder 2100 may correspond to the main decoder 110 described with reference to FIG. 1.

The main decoder 2100 may include a data buffer 2110, a variable node updater 2120, a check node updater 2130, a check node passing unit 2140, and a syndrome checker 2150. The data buffer 2110, the check node updater 2130, the check node passing unit 2140, and the syndrome checker 2150 may have a similar structure to the data buffer 1110, the check node updater 1130, the check node passing unit 1140, and the syndrome checker 1150 described with reference to FIG. 3. Hereinafter, the LDPC decoder according to the second exemplary embodiment in the present disclosure will be described with a focus on the variable node updater 2120.

The variable node updater 2120 may include a plurality of unit logic circuit groups, a mode controller 2123, and a plurality of message buffers 2124 and 2125. When the LDPC decoding is performed based on the parity check matrix of FIG. 12, the variable node updater 2120 may include Q unit logic circuit groups.

Each of the unit logic circuit groups may include a plurality of unit logic circuits ULC1 and ULC2. Each of the unit logic circuit groups operates in a single mode to update one high-degree variable node in one cycle in response to the control of the mode controller 2123, or operates in multi-mode to update a plurality of low-degree variable nodes in one cycle.

The unit logic circuit groups may operate in parallel. The variable node updater 2120 may update Q high-degree variable nodes in the single mode or Q*K low-degree variable nodes in the multi-mode using the unit logic circuit groups. Here, K may represent the number of logic circuit groups included in the unit logic circuit group.

The first check node buffer 2124 may buffer check nodes necessary for the operation of the first unit logic circuits ULC1 included in the unit logic circuit groups, and the second check node buffer 2125 may buffer check nodes necessary for the operation of the second unit logic circuits UCL2 included in the unit logic circuit groups.

According to the second exemplary embodiment in the present disclosure, it is possible to further improve the parallelism of the LDPC decoding by efficiently utilizing computational resources even in the LDPC decoder that performs the LDPC decoding based on a QC-LDPC code. Accordingly, it is possible to improve the performance of the LDPC decoder.

The LDPC decoder according to exemplary embodiments in the present disclosure may be applied to various devices and systems. For example, the LDPC decoder may be applied to a storage device to support the storage device to accurately and quickly output data stored therein. Hereinafter, the storage device according to exemplary embodiments in the present disclosure will be described in more detail with reference to FIGS. 14 to 19.

Figure 14:
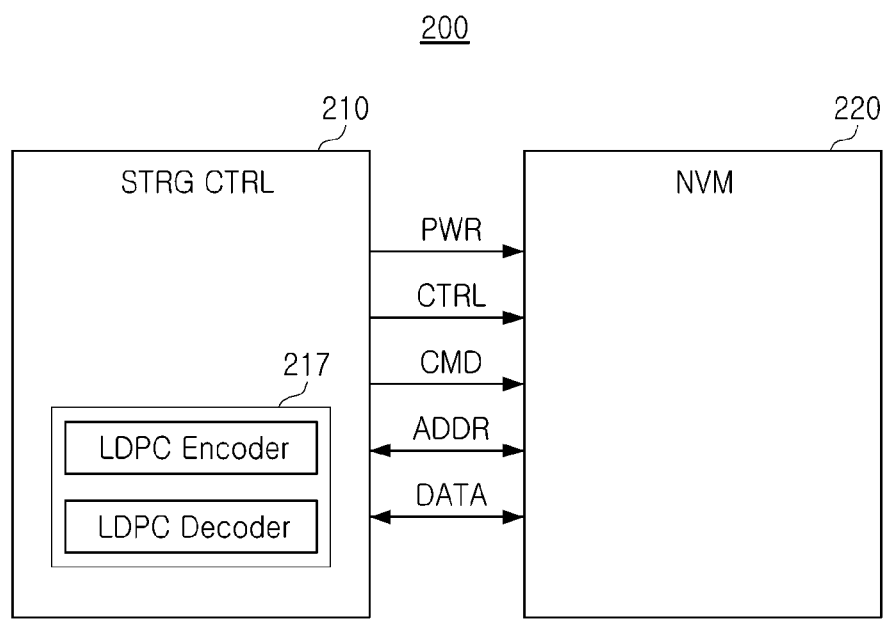
FIG. 14 is a block diagram illustrating a storage device according to an exemplary embodiment in the present disclosure.

FIG. 14 is a block diagram illustrating a storage device according to an exemplary embodiment in the present disclosure.

A storage device 200 may include a storage controller 210 and a nonvolatile memory 220.

The nonvolatile memory 220 may perform erase, write, and read operations under the control of the storage controller 210. The nonvolatile memory 220 may receive a command CMD, an address ADDR, and data DATA from the storage controller 210 through an input/output line. Also, the nonvolatile memory 220 may receive power PWR from the storage controller 210 through a power line, and receive a control signal CTRL from the storage controller 210 through a control line. The control signal CTRL may include a command latch enable CLE, an address latch enable ALE, a chip enable nCE, a write enable nWE, a read enable nRE, and the like.

The storage controller 210 may generally control the operation of the nonvolatile memory 220. The storage controller 210 may include an LDPC unit 217 that corrects an error bit. The LDPC unit 217 may include an LDPC encoder and an LDPC decoder.

The LDPC encoder may perform error correction encoding on data to be programmed in the nonvolatile memory 220 to generate data to which a parity bit is added. The parity bit may be stored in the nonvolatile memory 220.

The LDPC decoder may perform error correction decoding on data read from the nonvolatile memory 220. The LDPC decoder may determine whether the error correction decoding succeeds, and output an indication signal according to the determination result. The LDPC decoder may use the parity bit generated in the LDPC encoding process to correct error bits of data.

Meanwhile, when the number of error bits is greater than the correctable error bit limit, the LDPC unit 217 may not correct the error bits. In this case, an error correction fail signal may be generated.

The LDPC unit 217 may perform error correction using a low density parity check (LDPC) code. The LDPC unit 217 may include any circuit, system, or device for error correction. Here, the LDPC code includes a binary LDPC code and a non-binary LDPC code. Depending on the implementation, the LDPC unit 217 may perform error bit correction using hard decision data and soft decision data.

The storage controller 210 and the nonvolatile memory 220 may be integrated into one semiconductor device. For example, the storage controller 210 and the nonvolatile memory 220 may be integrated into one semiconductor device to configure a solid state drive (SSD). The solid state drive may include a storage device configured to store data in a semiconductor memory.

The storage controller 210 and the nonvolatile memory 220 may be integrated into one semiconductor device to configure a memory card. For example, the storage controller 210 and the nonvolatile memory 220 may be integrated into one semiconductor device to configure memory cards such as a personal computer memory card international association (PCMCIA), a compact flash card (CF), smart media cards (SM and SMC), a memory stick, multimedia cards (MMC, RS-MMC, and MMCmicro), an SD card (SD, mini SD, microSD, and SDHC), and a universal flash storage (UFS).

Figure 15:
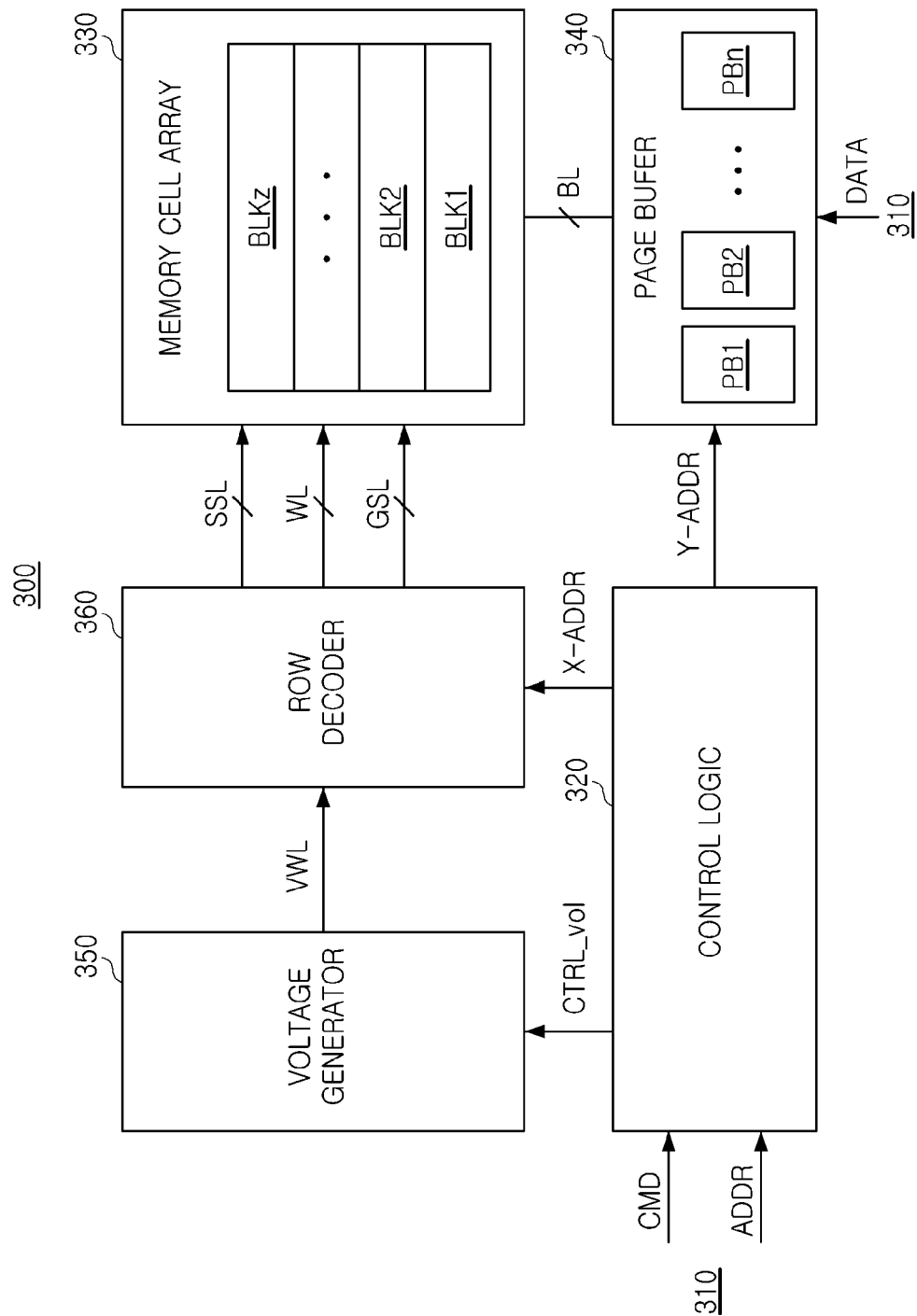
FIG. 15 is a diagram for describing in more detail a nonvolatile memory of FIG. 14.

FIG. 15 is a diagram for describing in more detail the nonvolatile memory of FIG. 14.

FIG. 15 is an exemplary block diagram illustrating a memory device. Referring to FIG. 15, the memory device 300 may include a control logic circuit 320, a memory cell array 330, a page buffer 340, a voltage generator 350, and a row decoder 360. Although not fully illustrated in FIG. 15, the memory device 300 may further include a memory interface circuit 310, and further include column logic, a pre-decoder, a temperature sensor, a command decoder, an address decoder, and the like.

The control logic circuit 320 may generally control various operations in the memory device 300. The control logic circuit 320 may output various control signals in response to a command CMD and/or an address ADDR from the memory interface circuit 310. For example, the control logic circuit 320 may output a voltage control signal CTRL vol, a row address X-ADDR, and a column address Y-ADDR.

The memory cell array 330 may include a plurality of memory blocks BLK1 to BLKz (z is a positive integer), and each of the plurality of memory blocks BLK1 to BLKz may include a plurality of memory cells. The memory cell array 330 may be connected to the page buffer unit 340 through bit lines BL, and connected to a row decoder 360 through word lines WL, string select lines SSL, and ground select lines GSL.

In an exemplary embodiment, the memory cell array 330 may include a 3-dimensional (3D) memory cell array, and the 3D memory cell array may include a plurality of NAND strings. Each NAND string may include memory cells respectively connected to word lines stacked vertically on a substrate. U.S. Patent Laid-Open Publication No. 7,679,133, U.S. Patent Laid-Open Publication No. 8,553,466, U.S. Patent Laid-Open Publication No. 8,654,587, U.S. Patent Laid-Open Publication No. 8,559,235, and U.S. Patent Application Publication No. 2011/0233648 are incorporated herein by reference in their entirety. In an exemplary embodiment, the memory cell array 330 may include a 2-dimensional (2D) memory cell array, and the 2D memory cell array may include a plurality of NAND strings arranged along a row direction and a column direction.

The page buffer 340 may include a plurality of page buffers PB1 to PBn (n is an integer greater than or equal to 3), and the plurality of page buffers PB1 to PBn are respectively connected to the memory cells through a plurality of bit lines BL. The page buffer 340 may select at least one of the bit lines BL in response to a column address Y-ADDR. The page buffer 340 may operate as a write driver or a sense amplifier according to an operation mode. For example, during the program operation, the page buffer 340 may apply a bit line voltage corresponding to data to be programmed to a selected bit line. During the read operation, the page buffer 340 may sense data stored in the memory cell by sensing a current or voltage of the selected bit line.

The voltage generator 350 may generate various types of voltages for performing program, read, and erase operations based on the voltage control signal CTRL vol. For example, the voltage generator 350 may generate a program voltage, a read voltage, a program verify voltage, an erase voltage, etc., as a word line voltage VWL.

The row decoder 360 may select one of the plurality of word lines WL in response to the row address X-ADDR and select one of the plurality of string selection lines SSL. For example, during the program operation, the row decoder 360 may apply the program voltage and the program verify voltage to the selected word line, and during the read operation, apply the read voltage to the selected word line.

Figure 16:
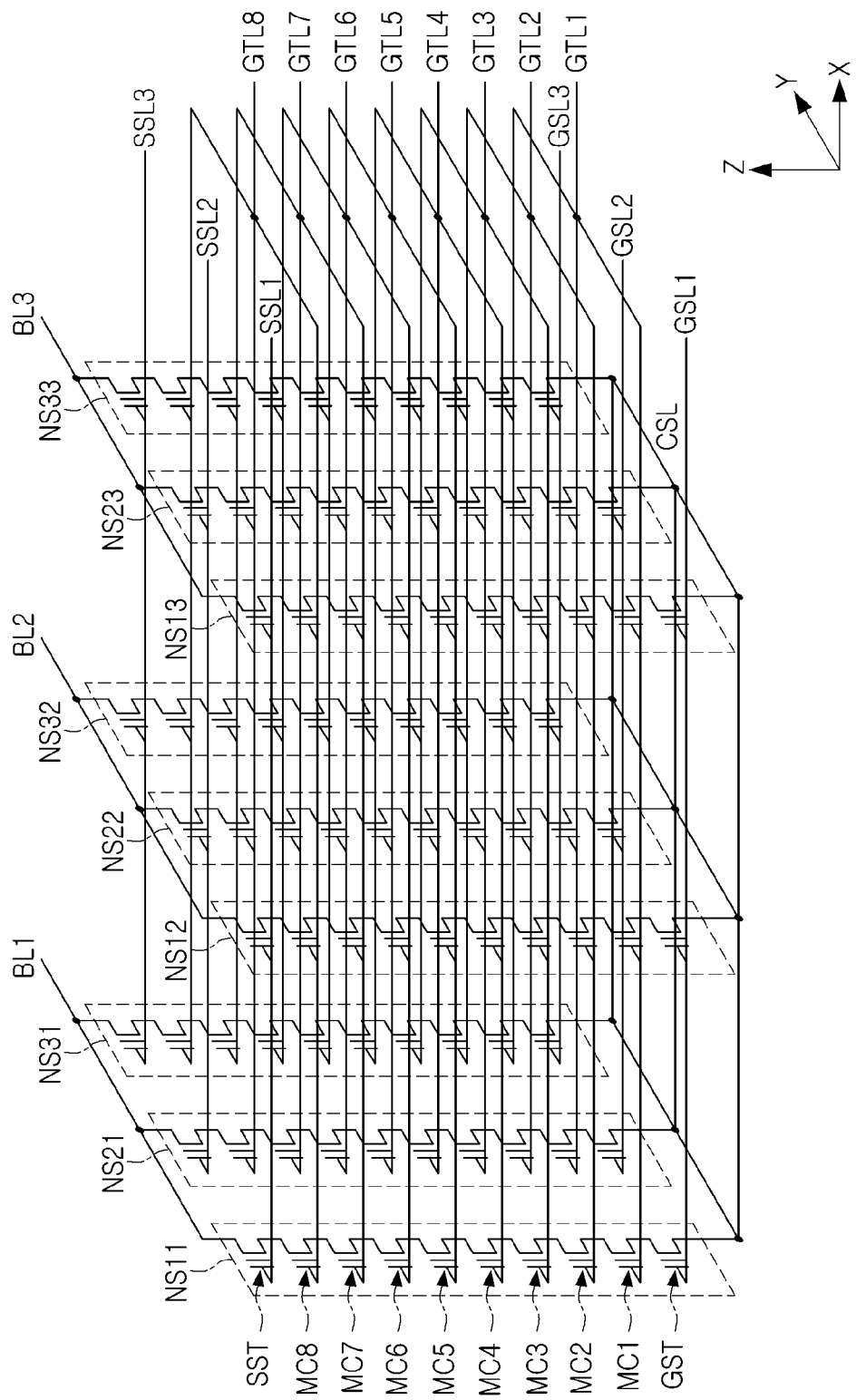
FIG. 16 is a diagram for describing a 3D V-NAND structure applicable to a storage device according to an exemplary embodiment in the present disclosure.

FIG. 16 is a diagram for describing a 3D V-NAND structure applicable to a storage device according to an exemplary embodiment in the present disclosure. When the nonvolatile memory of the storage device is implemented as a 3D V-NAND type flash memory, each of a plurality of memory blocks constituting the nonvolatile memory may be represented by an equivalent circuit as illustrated in FIG. 16.

A memory block BLKi illustrated in FIG. 16 represents a three-dimensional memory block formed on a substrate in a three-dimensional structure. For example, a plurality of memory NAND strings included in the memory block BLKi may be formed in a direction perpendicular to the substrate.

Referring to FIG. 16, the memory block BLKi may include a plurality of memory NAND strings NS11 to NS33 connected between bit lines BL1, BL2, and BL3 and a common source line CSL. Each of the plurality of memory NAND strings NS11 to NS33 may include a string select transistor SST, a plurality of memory cells MC1, MC2, ..., MC8, and a ground select transistor GST. FIG. 16 illustrates that each of the plurality of memory NAND strings NS11 to NS33 includes eight memory cells MC1, MC2, ..., MC8, but is not necessarily limited thereto.

The string selection transistor SST may be connected to the corresponding string selection lines SSL1, SSL2, and SSL3. The plurality of memory cells MC1, MC2, ..., MC8 may be connected to corresponding gate lines GTL1, GTL2, ..., GTL8, respectively. The gate lines GTL1, GTL2, ..., GTL8 may correspond to word lines, and some of the gate lines GTL1, GTL2, ..., GTL8 may correspond to dummy word lines. The ground select transistor GST may be connected to the corresponding ground select lines GSL1, GSL2, and GSL3. The string select transistor SST may be connected to the corresponding bit lines BL1, BL2, and BL3, and the ground select transistor GST may be connected to the common source line CSL.

Word lines (e.g., WL1) having the same height are commonly connected, and the ground select lines GSL1, GSL2, and GSL3 and the string select lines SSL1, SSL2, and SSL3 may each be separated from each other. FIG. 16 illustrates that the memory block BLK is connected to eight gate lines GTL1, GTL2, ..., GTL8 and three bit lines BL1, BL2, BL3, but is not necessarily limited thereto.

When the memory cells included in the memory block BLK are programmed, threshold voltages of the memory cells may form certain probability distributions. The threshold voltage distributions may be mapped to different logic states.

Figure 17A:
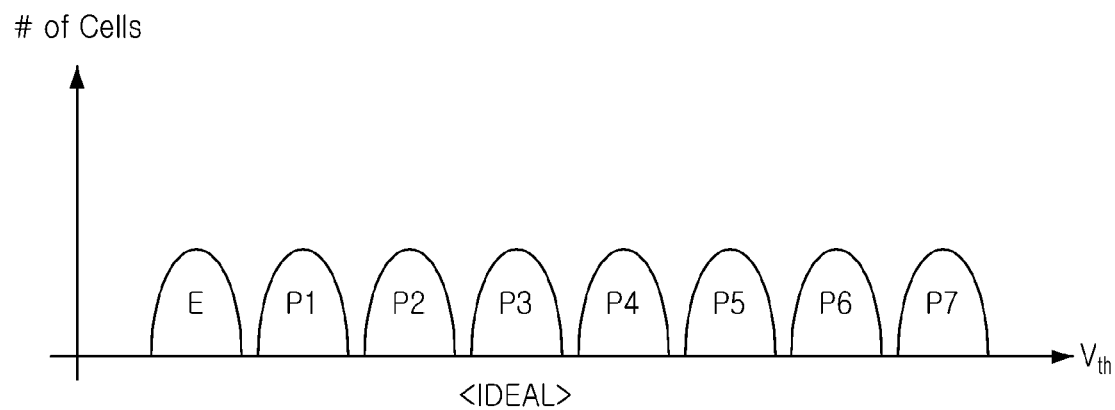
FIGS. 17A and 17B are diagrams illustrating a threshold voltage distribution of memory cells.
Figure 17B:
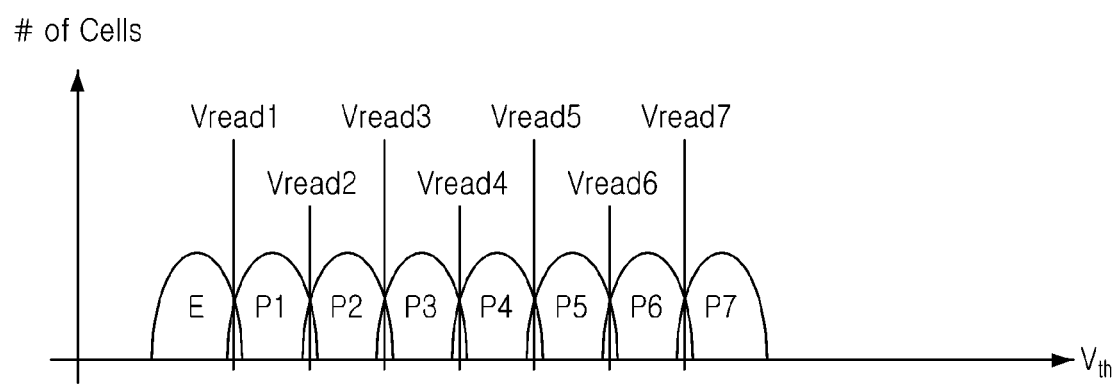

FIGS. 17A and 17B are diagrams for describing threshold voltage distributions of memory cells.

In the graphs illustrated in FIGS. 17A and 17B, a horizontal axis represents a magnitude Vth of a threshold voltage, and a vertical axis represents the number of memory cells (# of Cells). FIGS. 17A and 17B illustrate a logic state represented by each threshold voltage distribution taking as an example a case in which the memory cell is a triple level cell (TLC) storing 3-bit data.

When three bits are programmed in the memory cells of the TLC memory device, any one of eight threshold voltage distributions is formed in the memory cell.

Due to minute differences in electrical characteristics between the plurality of memory cells, each threshold voltage of each of the memory cells programmed with the same data form a threshold voltage distribution within a predetermined range. In the case of the TLC, as illustrated in the drawing, threshold voltage distributions P1 to P7 of seven program states and a threshold voltage distribution E of one erase state are formed. FIG. 17A is an ideal distribution diagram illustrating that no state distributions overlap, and a read voltage margin of a certain range is provided for each threshold voltage distribution.

As illustrated in FIG. 17B, in the case of the flash memory, a charge loss in which electrons trapped in a floating gate or a tunnel oxide are emitted may occur over time. In addition, a tunnel oxide deteriorates while the programming and erasing are repeated, thereby further increasing the charge loss. The charge loss may reduce the threshold voltage. For example, the distribution of the threshold voltage may be shifted to the left.

Also, the program disturbance, erase disturbance, and/or back pattern dependency phenomena may increase the distribution of threshold voltages. Accordingly, the threshold voltage distributions of each adjacent state E and P1 to P7 may overlap each other as illustrated in FIG. 17B due to the deterioration in the characteristics of the memory cell due to the above-described reason.

When the threshold voltage distributions overlap, the read data may include many errors. For example, if the memory cell is in an on state when a third read voltage Vread3 is applied, it is determined that the memory cell has the second program state P2, and if the memory cell is in an off state, it is determined that the memory cell has the third program state P3. However, when the third read voltage Vread3 is applied in a section where the second program state P2 and the third program state P3 overlap, the memory cell may be read as the on state even though the memory cell is in the off state. Accordingly, as the threshold voltage distributions overlap, the read data may include many error bits.

Accordingly, a technology capable of accurately reading data stored in a memory cell of a semiconductor memory device is required.

Figure 18:
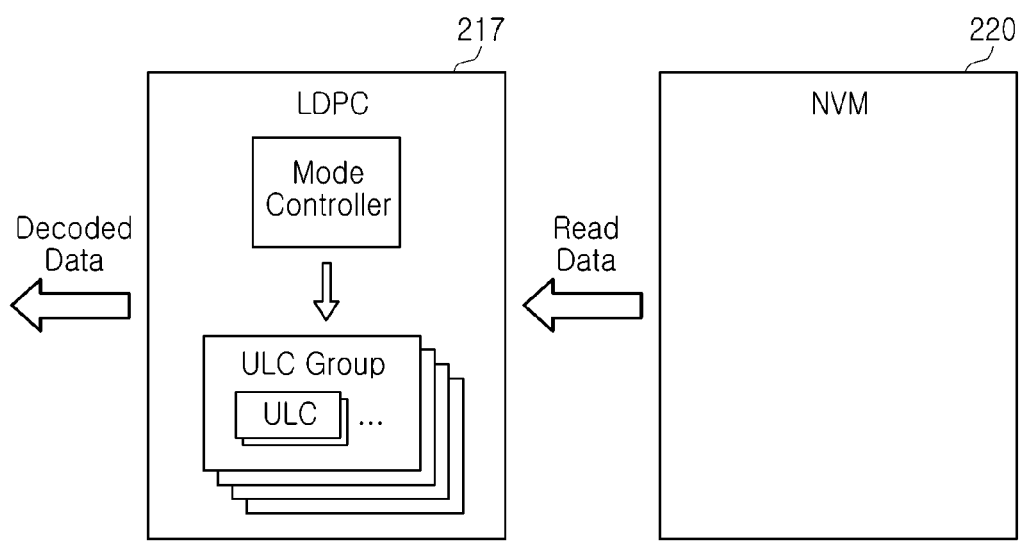
FIG. 18 is a diagram for describing an error correction method of the storage device according to the exemplary embodiment in the present disclosure.

FIG. 18 is a diagram for describing an error correction method of the storage device according to the exemplary embodiment in the present disclosure.

FIG. 18 illustrates the nonvolatile memory 220 and the LDPC unit 217 described with reference to FIG. 14.

The LDPC unit 217 may perform the LDPC encoding and LDPC decoding based on an irregular LDPC code. The nonvolatile memory 220 may store data encoded with an irregular LDPC code.

The LDPC unit 217 may output the decoded data to the outside by performing the LDPC decoding on the data read from the nonvolatile memory 220. According to an exemplary embodiment in the present disclosure, the LDPC unit 217 may include unit logic circuit groups (ULC Group) including a plurality of unit logic circuits (ULC), and a mode controller for controlling the unit logic circuit groups.

The LDPC unit 217 may perform an operation of initializing variable nodes with values of data read from the nonvolatile memory 220, updating the check nodes connected to the variable nodes, updating the variable nodes connected to the check nodes, and outputting the values of the variable nodes as the decoded data to the outside according to a syndrome check result of the updated variable nodes.

According to the implementation, the LDPC unit 217 may include M*N sub-matrices, each of which may update the check nodes and the variable nodes based on a parity check matrix that is a zero matrix or a Q*Q (where Q is a natural number) dimension cyclic shift identity matrix.

According to an exemplary embodiment in the present disclosure, the LDPC unit 217 may update the variable nodes by performing Q variable nodes in one cycle or Q*K variable nodes by repeatedly performing an operation of updating Q variable nodes in one cycle or simultaneously updating Q*K variable nodes in one cycle depending on whether the degrees of the variable nodes exceed the threshold degree. Here, K may correspond to the number of unit logic circuits included in one unit logic circuit group.

According to an exemplary embodiment in the present disclosure, the parallelism of the LDPC decoding may be further improved in an LDPC decoder capable of updating variable nodes in parallel. Accordingly, the throughput of the LDPC decoder may be improved, and errors in data output from the nonvolatile memory 220 may be quickly corrected. Accordingly, it is possible to improve the performance and reliability of the storage device 200.

Figure 19:
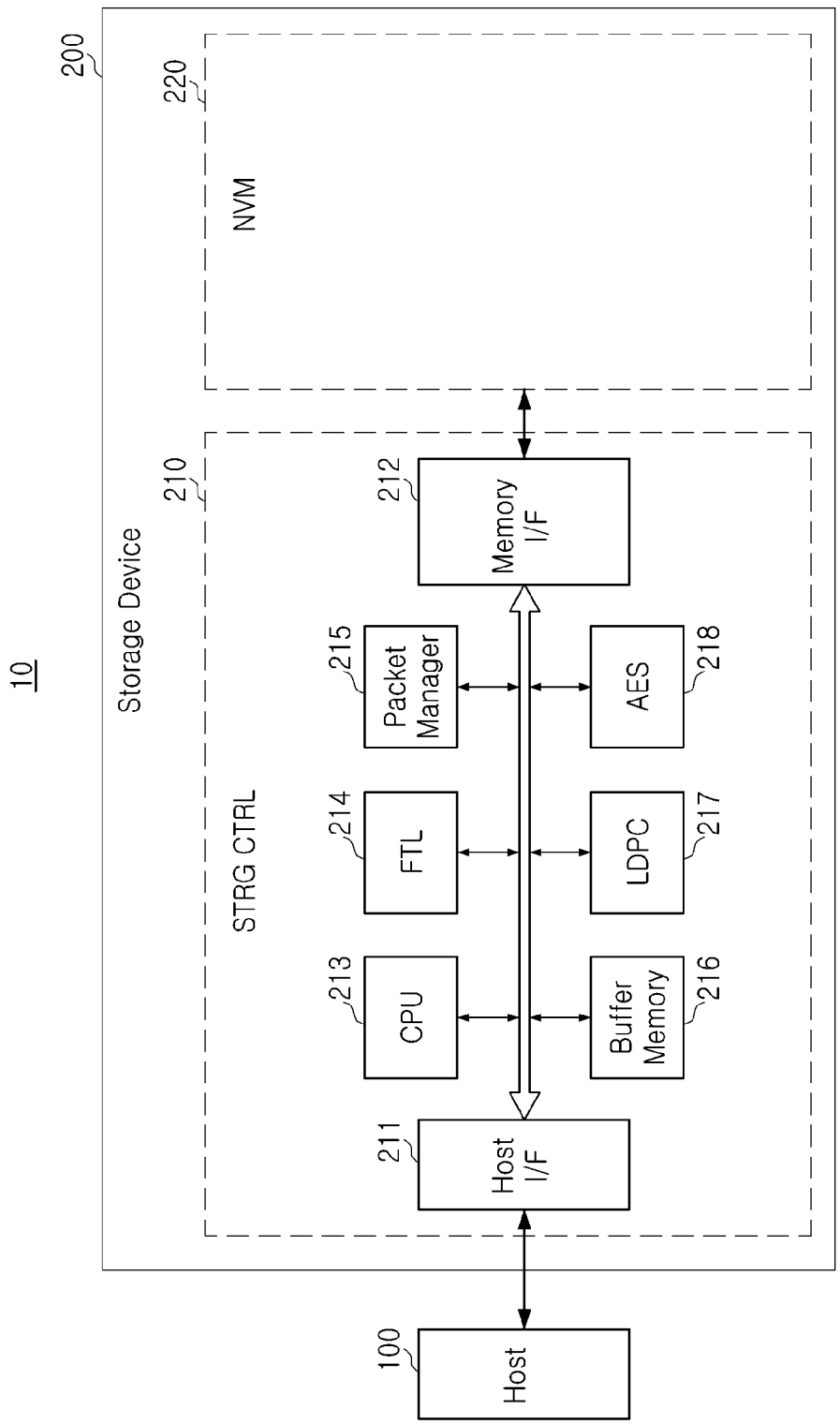
FIG. 19 is a block diagram illustrating in more detail the storage device according to the exemplary embodiment in the present disclosure.

FIG. 19 is a block diagram illustrating a host-storage system according to an exemplary embodiment in the present disclosure.

The host-storage system 10 may include the host 100 and the storage device 200. In addition, the storage device 200 may include the storage controller 210 and the nonvolatile memory (NVM) 220.

The host 100 may include electronic devices, for example, portable electronic devices such as a mobile phone, an MP3 player, and a laptop computer, or electronic devices such as a desktop computer, a game machine, TV, and a projector. The host 100 may include at least one operating system (OS). The operating system may overall manage and control functions and operations of the host 100.

The storage device 200 may include storage media for storing data according to a request from the host 100. As an example, the storage device 200 may include at least one of a solid state drive (SSD), an embedded memory, and a removable external memory. When the storage device 200 is the SSD, the storage device 200 may be a device conforming to a nonvolatile memory express (NVMe) standard. When the storage device 200 is the embedded memory or the external memory, the storage device 200 may be a device conforming to a universal flash storage (UFS) or an embedded multi-media card (eMMC) standard. The host 100 and the storage device 200 may each generate a packet according to an adopted standard protocol and transmit the generated packet.

The nonvolatile memory 220 may retain stored data even when power is not supplied. The nonvolatile memory 220 may store data provided from the host 100 through the program operation, and may output data stored in the nonvolatile memory 220 through the read operation.

When the nonvolatile memory 220 includes the flash memory, the flash memory may include a 2D NAND memory array or a 3D (or vertical) NAND (VNAND) memory array. As another example, the storage device 200 may include other various types of nonvolatile memories. For example, the storage device 200 may include a magnetic RAM (MRAM), a spin-transfer torque MRAM (MRAM), a conductive bridging RAM (CBRAM), a ferroelectric RAM (FeRAM), a phase RAM (PRAM), a resistive memory, and various other types of memory.

The storage controller 210 may control the nonvolatile memory 220 in response to a request from the host 100. For example, the storage controller 210 may provide the data read from the nonvolatile memory 220 to the host 100, and store the data provided from the host 100 in the nonvolatile memory 220. For this operation, the storage controller 210 may support operations such as read, program, and erase of the nonvolatile memory 220.

The storage controller 210 may include a host interface 211, a memory interface 212, and a central processing unit (CPU) 213. In addition, the storage controller 210 may further include a flash translation layer (FTL) 214, a packet manager 215, a buffer memory 216, an error correction code (ECC) 217 engine, and an advanced encryption standard (AES) engine 218. The storage controller 210 may further include a working memory (not illustrated) into which the flash translation layer (FTL) 214 is loaded and may control data write and read operations into and from the nonvolatile memory 220 by allowing the CPU 213 to execute the flash translation layer (FTL) 214.

The host interface 211 may transmit and receive packets to and from the host 100. A packet transmitted from the host 100 to the host interface 211 may include a command, data to be written into the nonvolatile memory 220, or the like, and a packet transmitted from the host interface 211 to the host 100 may include a response to the command, data read from the nonvolatile memory 220, or the like.

The memory interface 212 may transmit data to be written into the nonvolatile memory 220 to the nonvolatile memory 220 or receive data read from the nonvolatile memory 220. The memory interface 212 may be implemented to comply with a standard protocol such as a toggle or an open NAND flash interface (ONFI).

The flash translation layer 214 may perform various functions such as address mapping, wear-leveling, and garbage collection. The address mapping operation is an operation of changing a logical address received from the host 100 into a physical address used to actually store data in the nonvolatile memory 220. The wear-leveling is a technique for preventing excessive deterioration in a specific block by allowing blocks in the nonvolatile memory 220 to be uniformly used, and may be implemented by, for example, a firmware technique for balancing erase counts of physical blocks. The garbage collection is a technique for securing usable capacity in the nonvolatile memory 220 by copying valid data of a block to a new block and then erasing an existing block.

The packet manager 215 may generate a packet according to the protocol of the interface negotiated with the host 100 or parse various types of information from the packet received from the host 100. Also, the buffer memory 216 may temporarily store data to be written into the nonvolatile memory 220 or data to be read from the nonvolatile memory 220. The buffer memory 216 may be provided in the storage controller 210, but may be disposed outside the storage controller 210.

The LDPC unit 217 may perform an error detection and correction function on read data read from the nonvolatile memory 220. More specifically, the LDPC unit 217 may generate parity bits for write data to be written into the nonvolatile memory 220, and the generated parity bits may be stored in the nonvolatile memory 220 together with the write data. When reading data from the nonvolatile memory 220, the LDPC unit 217 may use parity bits read from the nonvolatile memory 220 together with the read data to correct the error in the read data, and output the error-corrected read data.

The AES engine 218 may perform at least one of an encryption operation and a decryption operation on data input to the storage controller 210 using a symmetric-key algorithm.

Meanwhile, in response to the demand for high-capacity storage device, the number of bits that may be stored in one memory cell of the nonvolatile memory 220 tends to increase. For example, the nonvolatile memory 220 may include not only TLC capable of storing 3-bit data per memory cell and a quadruple level cell (QLC) capable of storing 4-bit data per memory cell, but also a penta level cell capable of storing 5-bit data per memory cell.

As the amount of data that may be stored in one page of the nonvolatile memory 220 increases, the size of LDPC-encoded data may also increase. In order to perform the LDPC encoding on large data, the size of the parity check matrix may also increase. The number of variable nodes included in the parity check matrix may increase, and the degree of variable nodes may vary.

According to an exemplary embodiment in the present disclosure, the LDPC unit 217 may support three or more various parallel operation modes. For example, the LDPC unit 217 may support a mode in which one unit logic circuit group processes one high-degree variable node, a mode in which one unit logic circuit group processes two intermediate-degree variable nodes, a mode in which one unit logic circuit processes four low-degree variable nodes, etc. According to an exemplary embodiment in the present disclosure, the computational resource of the LDPC unit 217 may be more efficiently utilized in the high-capacity storage device 200. The error in data from the nonvolatile memory 220 may be quickly corrected, so it is possible to improve the data processing performance of the storage device 200.

According to an exemplary embodiment in the present disclosure, it is possible to efficiently utilize processing resources by allowing a low density parity check (LDPC) decoder to update one high-degree variable node in one cycle or update a plurality of low-degree variable nodes at the same time.

According to an exemplary embodiment in the present disclosure, since the LDPC decoder may update a plurality of low-degree variable nodes at the same time, it is possible to improve throughput of the LDPC decoder and decoding latency.

According to an exemplary embodiment in the present disclosure, it is possible to quickly and accurately read data stored in a memory cell using an LDPC decoder with improved decoding latency.

The problems of the present disclosure are not limited to the above-described problems. That is, other problems that are not mentioned may be obviously understood by those skilled in the art from the following specification.

The present disclosure is not limited by the above-described exemplary embodiments and the accompanying drawings, but is intended to be limited by the appended claims. Accordingly, various types of substitutions, modifications and changes will be possible by those of ordinary skill in the art without departing from the present inventive concept described in the claims, and belong to the scope of the present inventive concept.

What is claimed is:

1. A low density parity check (LDPC) decoder initializing variable nodes with a value of a codeword and outputting the variable nodes updated with reference to an irregular parity check matrix as decoded messages, comprising:

a plurality of unit logic circuits operating in a single mode in which all the unit logic circuits update one variable node group including at least one variable node, or a multi-mode in which each of the unit logic circuits updates a plurality of variable node groups in parallel by updating different variable nodes; and a mode controller controlling the plurality of unit logic circuits to update a high-degree variable node group having a degree greater than a threshold degree among the variable node groups in the single mode, and update a low-degree variable node group having a degree less than or equal to the threshold degree among the variable node groups in the multi-mode.

2. The LDPC decoder of claim 1, wherein the threshold degree is determined based on a maximum degree among degrees of the variable node groups and the number of the plurality of unit logic circuits.

3. The LDPC decoder of claim 1, wherein each of the plurality of unit logic circuits includes an adder having two or more inputs.

4. The LDPC decoder of claim 3, wherein the threshold degree is further determined based on the number of inputs of the adder.

5. The LDPC decoder of claim 1, wherein the plurality of unit logic circuits includes a first unit logic circuit and a second unit logic circuit, and
in the single mode, the first unit logic circuit performs a sum operation on first check nodes among check nodes connected to the one variable node group, and the second unit logic circuit performs a sum operation on second check nodes among the connected check nodes so that the plurality of unit logic circuits update a value of the one variable node group.

6. The LDPC decoder of claim 5, further includes a plurality of check node buffers for buffering values of check nodes to be processed by each of the plurality of unit logic circuits.

7. The LDPC decoder of claim 1, wherein the mode controller updates the variable node groups in a predetermined order, and switches an operation mode of the plurality of unit logic circuits in runtime according to a degree of a target variable node group to be updated.

8. The LDPC decoder of claim 1, wherein the mode controller updates the variable node groups in a predetermined order, and controls the plurality of unit logic circuits to update a first target variable node group in the single mode when the first target variable node group to be updated is a high-degree variable node group, skips the update of the first target variable node group when the first target variable node group is a low-degree variable node group, and controls the plurality of unit logic circuits to update the first variable node group and a second target variable node group in the multi-mode in a turn to update the second target variable node group which is a low-degree variable node group.

9. The LDPC decoder of claim 1, wherein the mode controller arranges the variable node groups in descending order of degree, controls the plurality of unit logic circuits to update high-degree variable node groups among the variable node groups in the single mode in a first time period, and controls the plurality of unit logic circuits to update low-degree variable node groups among the variable node groups in the multi-mode in a second time period after the first time period.

10. The LDPC decoder of claim 1, wherein the degree is the number of check nodes connected to one of the variable node groups in the LDPC code represented by the parity check matrix.

11. A low density parity check (LDPC) decoder, comprising:
a data buffer buffering data encoded with an irregular LDPC code and providing a value of the data to variable nodes;
a check node updater updating check nodes connected to the variable nodes;
a variable node updater updating the variable nodes connected to the updated check nodes; and
a syndrome checker outputting the values of the variable nodes as decoded data according to a syndrome check result of the updated variable nodes,
wherein the variable node updater includes one or more unit logic circuit groups, and controls each of the unit logic circuit groups to update one variable node in one cycle or each of the unit logic circuits included in each of the unit logic circuit group to update different variable nodes in parallel in one cycle according to an amount of computation required for each of the variable nodes.

12. The LDPC decoder of claim 11, wherein the required amount of computation is determined based on the number of check nodes connected to the variable nodes.

13. The LDPC decoder of claim 11, wherein each of the unit logic circuit groups updates one variable node in which the required amount of computation is greater than a threshold amount of computation in one cycle, or updates a plurality of variable nodes in which the required amount of computation is less than or equal to the threshold amount of computation in one cycle, and
the threshold amount of computation is determined based on a maximum operation amount of each of the plurality of unit logic circuits.

14. The LDPC decoder of claim 11, wherein the LDPC decoder repeatedly performs an operation of updating the check nodes and an operation of updating the variable nodes when at least one of components of a syndrome vector does not have a value of "0" as a result of a syndrome check of the updated variable nodes.

15. The LDPC decoder of claim 11, wherein the check node updater updates each of the check nodes by performing a minimum value (min) operation of the variable nodes connected to each of the check nodes, and
the variable node updater updates each of the variable nodes by performing a sum operation of check nodes connected to each of the variable nodes.

16. The LDPC decoder of claim 15, wherein one unit logic circuit group includes adders for performing a sum operation of the check nodes.

17. The LDPC decoder of claim 11, wherein the LDPC decoder includes M*N (M and N are a natural number) sub-matrices, and each of the sub-matrices stores a parity check matrix that is a zero matrix or a Q*Q (where Q is a natural number) dimensional cyclic shift identity matrix, and
the variable node updater includes Q unit logic circuit groups each including K (where K is a natural number) unit logic circuits, and the Q unit logic circuit groups include Q variable nodes corresponding to one column or updates Q*K variable nodes corresponding to K columns in parallel.

18. A storage device, comprising:
a memory device storing data encoded with an irregular low density parity check (LDPC) code; and
an LDPC unit initializing variable nodes with a value of data output from the memory device, updating check nodes connected to the variable nodes, updating the variable nodes by repeatedly performing an operation of updating Q (where Q is a natural number) variable nodes in one cycle or simultaneously updating Q*K (where K is a natural number) variable nodes in one cycle depending on whether degrees of each of the variable nodes exceed a threshold degree, and outputting values of the variable nodes according to a syndrome check result of the variable nodes.

19. The storage device of claim 18, wherein the LDPC unit updates the check nodes and the variable nodes based on a parity check matrix that includes M*N (M and N are a natural number) sub-matrices, each of the sub-matrices is a zero matrix or a Q*Q-dimensional cyclic shift identity matrix.

20. The storage device of claim 19, wherein the threshold degree is determined based on a maximum degree of the variable nodes and the number Q*K of unit logic circuits included in the LDPC unit.

* * * * *